United States Patent
Egashira et al.

(10) Patent No.: US 6,469,535 B1
(45) Date of Patent: Oct. 22, 2002

(54) METHOD FOR EXAMINING SEMICONDUCTOR SUBSTRATE, AND METHOD FOR CONTROLLING FABRICATION PROCESS OF SEMICONDUCTOR DEVICES

(75) Inventors: Kyoko Egashira, Kyoto; Koji Eriguchi, Osaka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/327,467

(22) Filed: Jun. 8, 1999

(30) Foreign Application Priority Data

Jun. 10, 1998 (JP) .......................... 10-162081
Dec. 4, 1998 (JP) .......................... 10-345073

(51) Int. Cl.⁷ .................. G01R 31/26; G01R 27/08; H01L 21/00
(52) U.S. Cl. .................. 324/765; 324/718; 324/719; 438/4; 438/10; 438/14; 438/17
(58) Field of Search ................ 324/765, 718, 324/719; 438/17, 10, 4, 14

(56) References Cited

U.S. PATENT DOCUMENTS

| | | | | |
|---|---|---|---|---|
| 3,609,537 A | * | 9/1971 | Healy | 324/765 |
| 4,841,239 A | * | 6/1989 | Foell et al. | 324/765 |
| 5,598,102 A | * | 1/1997 | Smayling et al. | 324/537 |
| 5,815,002 A | * | 9/1998 | Nikawa | 324/765 |
| 6,078,183 A | * | 6/2000 | Cole | 324/765 |

FOREIGN PATENT DOCUMENTS

| | | |
|---|---|---|
| JP | 61-159748 | 7/1986 |
| JP | 5-152410 | 6/1993 |

* cited by examiner

*Primary Examiner*—N. Le
*Assistant Examiner*—Wasseem H. Hamdan
(74) *Attorney, Agent, or Firm*—Nixon Peabody LLP; Donald R. Studebaker

(57) ABSTRACT

A particular portion of a damaged layer within a semiconductor substrate, which is likely to affect the performance of resulting semiconductor devices, is distinguished from the other negligible portions thereof and the depth of that non-negligible portion is detected. An Si substrate is placed on a stage, and a mercury electrode, which forms a Schottky barrier with the Si substrate, is brought into contact with the surface of the Si substrate. When a constant current is supplied from a constant current source between the mercury electrode and the Si substrate, charges are trapped at the trap centers in the damaged layer within the Si substrate. As a result, a potential on the conduction band rises near the surface of the Si substrate. And if the voltage between the electrode and the substrate is increased along with the potential rise, a constant current flows. By measuring the variation in the saturated voltage with time using a voltmeter, the defect density can be estimated and the depth of only the particular portion of the damaged layer, having impact on the resulting devices, can be detected.

22 Claims, 20 Drawing Sheets

METHOD FOR EXAMINING SEMICONDUCTOR SUBSTRATE, AND METHOD FOR CONTROLLING FABRICATION PROCESS OF SEMICONDUCTOR DEVICES

BACKGROUND OF THE INVENTION

The present invention relates to a method for evaluating the surface state of a semiconductor substrate during a fabrication process of semiconductor devices and to a method for controlling the fabrication process of semiconductor devices based on the results of evaluation.

An "I-V method" is known as an exemplary technique for evaluating the surface state of a semiconductor substrate. In the I-V method, a metal electrode, which forms a Schottky barrier with a semiconductor substrate, is brought into contact with the substrate, and a voltage is applied between the substrate and the electrode to measure the amount of current flowing therebetween. Based on the resulting variation in current with the voltage applied, the surface state of the semiconductor substrate is evaluated according to this technique.

FIG. 18 is a schematic illustrating a measuring principle of this I-V method. As shown in FIG. 18, an Si substrate 1, which is a target of measurement, is placed on a stage 2 of this measuring system. And a mercury electrode 3, which forms a Schottky barrier with the Si substrate 1, is in contact with the surface of the Si substrate 1. A variable voltage is applied from a voltage supply 16 between the Si substrate 1 and the mercury electrode 3. And the resultant current and voltage are measured with an ammeter 17 and a voltmeter 5, respectively.

Hereinafter, results of I-V evaluation on the surface state of the semiconductor substrate 1, which was exposed to a plasma of the type increasing a contact resistance, will be described. In this case, an n-type silicon wafer, of which the surface is a (100) crystallographic plane and the resistivity is 10 Ω·cm, was used as the Si substrate 1. A parallel-plate reactive ion etching (RIE) system was used to form a region with plasma-induced damage (hereinafter, simply referred to as a "damaged layer"). A mixed gas of $CHF_3$ and $O_2$ was used as an etching gas, the pressure of the gas was set at 5 Pa, and a radio frequency power of 1 kW was applied at 13.56 MHz. Under these conditions, a damaged layer was formed within the Si substrate 1, which was then subjected to an $O_2$ down-flow plasma ashing process, and an organic compound deposited on the Si substrate 1 was removed therefrom. Subsequently, the Si substrate was subjected to down-flow etching within a plasma ambient using a mixed gas of $CF_4$ and $O_2$, thereby partially removing a surface region of the Si substrate 1 to a depth of 5 to 60 nm. During this down-flow etching (also called "chemical dry etching (CDE)"), the pressure of the gas was 133 Pa and an RF power of 300 W was applied at 13.56 MHz. With such CDE etching, since part of a semiconductor substrate is going to be removed by a chemical action almost without receiving the impact of plasma ions, no damaged layer is newly formed within the semiconductor substrate.

Thereafter, the Si substrate 1 was subjected to ashing with $O_2$ plasma, cleaning with $H_2SO_4$ and $H_2O_2$ and cleaning with diluted HF. Then, using the arrangement shown in FIG. 18, a variable voltage was applied between the mercury electrode 3 and the Si substrate 1 to measure resulting current and voltage by the ammeter 17 and voltmeter 5, respectively.

FIG. 19 illustrates data on the current-voltage characteristics obtained by this measurement. In FIG. 19, a curve indicated by "control" shows data on a bare silicon substrate 1, which was not subjected to either RIE or CDE. As shown in FIG. 19, in a substrate that was etched by the CDE technique to a depth as small as 5 nm, the resulting current was small and the current-voltage characteristics were disturbed. Accordingly, it is estimated that a lot of damage would have remained in such a substrate. It is also understood that some samples, which were supposed to show Schottky properties, actually show ohmic properties. Furthermore, even a bare silicon substrate showed ohmic properties if the substrate had been subjected to the CDE process. Thus, it is suggested that some change would have been caused in the surface state of the Si substrate as a result of the CDE process.

Next, supposing that any CDE-etched sample showed a similar variation in its surface state, RIE-induced damage in a CDE-etched sample was evaluated.

FIG. 20 illustrates a variation in current with an etch depth where a voltage applied is −0.2 V in the I-V characteristic curves shown in FIG. 19, to show in detail how the damage recovers in a CDE-etched sample. As shown in FIG. 20, when the etch depth is 40 nm, the current abruptly increases. In other words, it can be understood that the damaged layer reaches a depth of 40 nm as measured from the surface of the Si substrate 1.

As can be understood from the foregoing description, the depth of a damaged layer, which has been formed within a plasma-processed Si substrate 1, can be known during the fabrication process by utilizing the conventional I-V method. Accordingly, even if no devices such as transistors have been formed yet on the Si substrate 1, the surface state of the Si substrate 1 can be evaluated almost non-destructively. And based on the results of evaluation, it can be determined whether or not the plasma processing conditions should be changed and whether or not the process should proceed to the next step.

The conventional I-V evaluating method, however, has the following drawbacks.

FIG. 5 illustrates a resulting variation in contact resistance with a CDE etch depth of an Si substrate, which had been examined in the above-described manner and on which an AlSiCu interconnect had been formed. As shown in FIG. 5, even in the damaged Si substrate, when the depth of the etched part of the substrate reaches 3 nm, the contact resistance has decreased drastically. And when the etch depth reaches 8 nm, the contact resistance is almost zero. In other words, the increase in contact resistance due to the damage can be eliminated on and after the etch depth reaches 8 nm as measured from the surface of the Si substrate according to the results shown in FIG. 5. But the results shown in FIG. 5 are contradictory to those of the conventional I-V evaluation shown in FIG. 20. According to the conventional I-V evaluation, damage can be detected with sufficiently high sensitivity. However, in accordance with the I-V evaluation, subtle defects, which are located much deeper than the damaged layer to be actually removed, are also detected unnecessarily. That is to say, although some of the damages, which are located at a depth of 40 nm as shown in FIG. 20, may have no impact on the performance of semiconductor devices, the conventional I-V evaluation defines the etch depth at 40 nm. As a result, overly excessive etching is performed unintentionally, because 40 nm is much deeper than an actually required depth of 8 nm.

Accordingly, in actuality, the results of conventional I-V evaluation on the depth of the damaged layer were not applicable in an "in-line" fashion (or between processing steps of a fabrication process) to the determination of an etch depth for the purpose of removing the damaged layer. Thus, in practice, the depth of the damaged layer to be removed was determined empirically by measuring a contact resistance after interconnection had been formed.

SUMMARY OF THE INVENTION

An object of the present invention is providing respective methods for examining a semiconductor substrate and controlling a fabrication process of semiconductor devices, which contribute to various determinations during the fabrication process, by taking measures to evaluate the surface state of a plasma-processed semiconductor substrate with no interconnects formed thereon.

To achieve this object, according to the present invention, the surface state of a semiconductor substrate is evaluated by analyzing an electrical phenomenon resulting from a trapping change in the interface between the substrate and a measuring terminal placed thereon. For example, either a variation in current with a constant voltage applied between the substrate and the terminal or a variation in voltage with a constant current supplied therebetween is detected according to the present invention.

A method for examining a semiconductor substrate according to the present invention includes the steps of: a) placing a measuring terminal on the semiconductor substrate; b) applying one of voltage and current as an electrical stress between the substrate and the terminal at a constant rate to measure a variation in the other electrical stress caused between the substrate and the terminal; and c) evaluating the surface state of the substrate based on the variation in the other electrical stress.

In accordance with this method, current is injected into the surface region of the semiconductor substrate. As a result, the trap centers within the damaged layer are filled with charges and the band state changes in the semiconductor substrate. In this case, the change in band state is determined depending on a defect density near the surface of the semiconductor substrate. Accordingly, based on a variation in voltage or current due to the change in band state, information about the defect density at a depth of several nanometers as measured from the surface of the semiconductor substrate can be obtained. As a result, evaluation can be carried out quantitatively based on an actual defect density.

In one embodiment of the present invention, such a combination of materials as forming a Schottky barrier therebetween may be selected in the step a) for the semiconductor substrate and the measuring terminal. In the step b), the electrical stress may be applied in such a direction as causing a forward current.

In such an embodiment, the measurement can be performed easily.

In another embodiment of the present invention, the steps a) through c) may be performed on an initial semiconductor substrate with a damaged layer formed within the surface thereof and on a processed semiconductor substrate, from which part of the damaged layer has been removed by a predetermined depth. It may be estimated how deep the damaged layer has been removed based on the variation in the other electrical stress between the initial and processed semiconductor substrates.

In such an embodiment, only the depth of a particular portion of the damaged layer, having impact on the performance of semiconductor devices, can be detected accurately. That is to say, unlike the conventional I-V evaluation, a non-negligible portion of the damaged layer, having impact on the performance of semiconductor device, can be distinguished from the other negligible portion of the damaged layer. Thus, this method is applicable to an in-line non-destructive test in practice.

In this particular embodiment, current may be supplied as the electrical stress in the step b) and a defect density N in a surface region of the semiconductor substrate may be obtained in the step c) based on a variation $\Delta V$ in the voltage, which is the other electrical stress, with time. The variation $\Delta V$ may be given by $\Delta V = X \cdot q \cdot N/\in$, where X is a depth at which a charge trap center is located, q is a quantity of charges and $\in$ is a relative dielectric constant of the semiconductor substrate.

In such an embodiment, the defect density N within the semiconductor substrate can be estimated based on the variation $\Delta V$ in voltage. Thus, it is possible to spot where that portion of the damaged layer with a defect density high enough to seriously affect the performance of semiconductor devices is located within the semiconductor substrate.

In still another embodiment, the method may further include the step of forming an oxide film over the semiconductor substrate prior to the step a). In the step a), the measuring terminal may be placed on the oxide film formed over the semiconductor substrate.

In such an embodiment, the measuring sensitivity can be improved.

In this particular embodiment, the oxide film may be formed at a temperature as low as 400° C. or less in the step of forming the oxide film.

In such an embodiment, the crystallinity in the region to be measured does not recover at such a low temperature. Accordingly, the accuracy of measurement does not decline.

In an alternate embodiment, the oxide film may be formed to have such a thickness as enabling charge tunneling in the step of forming the oxide film.

In such an embodiment, it is possible to prevent the oxide film from interfering with the current flow, thus maintaining satisfactory measuring sensitivity.

In the embodiment where the oxide film is formed, the steps a) through c) may also be performed on an initial semiconductor substrate with a damaged layer formed within the surface thereof and on a processed semiconductor substrate, from which part of the damaged layer has been removed by a predetermined depth. And it may be estimated how deep the damaged layer has been removed based on the variation in the other electrical stress between the initial and processed semiconductor substrates.

In such an embodiment, the same effects as those described above can also be attained.

In this particular embodiment, current may be supplied as the electrical stress in the step b). And a depth, at which a variation in saturation value of the voltage, or the other electrical stress, reaches its local maximum, may be estimated as the depth of the damaged layer in the step c).

In such an embodiment, if several local maximums are obtained, then the respective types of impurities bringing about these local maximums can be known. Accordingly, a depth, which is reached by an impurity affecting the performance of semiconductor devices, can also be known. Thus, based on these results of evaluation, it is possible to etch the substrate to the very depth of the damaged layer, which is a root of problems in practice, and thereby avoid excessive etching.

The present invention also provides a method for controlling a fabrication process of semiconductor devices. In this method, the fabrication process is supposed to include the steps of: i) processing a semiconductor substrate under such conditions as doing damage to the substrate; and ii) removing a damaged layer, which has been caused by the step i). The process control method includes the steps of: a) placing a measuring terminal on the substrate at an arbitrary point in time during the steps i) and ii); b) applying one of voltage and current as an electrical stress between the substrate and the terminal at a constant rate to measure a variation in the other electrical stress caused between the substrate and the terminal; c) evaluating the surface state of the substrate based on the variation in the other electrical stress; and d) controlling the step ii) based on results of evaluation in the step c).

In accordance with this process control method, it is possible to control the process step of removing a plasma-etch-induced damaged layer, for example, to an adequate depth by utilizing the inventive method for examining a semiconductor substrate.

In one embodiment of the present invention, conditions for the step ii) may be changed or an endpoint of the step ii) may be detected in the step d).

In another embodiment of the present invention, such a combination of materials as forming a Schottky barrier therebetween may be selected in the step a) for the semiconductor substrate and the measuring terminal. And in the step b), the electrical stress may be applied in such a direction as causing a forward current.

Alternatively, the process control method may further include the step of forming an oxide film over the semiconductor substrate prior to the step a), in which the measuring terminal may be placed on the oxide film formed over the substrate.

In still another embodiment, the steps a) through c) may be performed on an initial semiconductor substrate with a damaged layer formed within the surface thereof and on a processed semiconductor substrate, from which part of the damaged layer has been removed by a predetermined depth. And in the step d), the step ii) may be controlled based on the variation in the other electrical stress between the initial and processed semiconductor substrates.

In this particular embodiment, if a Schottky contact is used, current may be supplied as the electrical stress in the step b). In the step c), a defect density N in a surface region of the semiconductor substrate may be obtained based on a variation $\Delta V$ in the voltage with time. The variation $\Delta V$ is given by $\Delta V = X \cdot q \cdot N / \in$, where X is a depth at which a charge trap center is located, q is a quantity of charges and $\in$ is a relative dielectric constant of the semiconductor substrate. And in the step d), when a variation in the defect density N between the initial and processed semiconductor substrates reaches a predetermined value, it is determined that the step ii) is finished.

Alternatively, according to a method using an oxide film as an interposed film, current may be supplied in the step b) as the electrical stress. And in the step c), a depth, at which a variation in saturation value of the voltage, or the other electrical stress, reaches its local maximum, may be estimated as the depth of the damaged layer.

DESCRIPTION OF THE PREFERRED EMBODIMENTS

In the following preferred embodiments, respective method of the present invention for evaluating the surface state of a semiconductor substrate by an I-V method and for controlling the fabrication process of semiconductor devices based on the results of evaluation will be described.

EMBODIMENT 1

Figure 1:
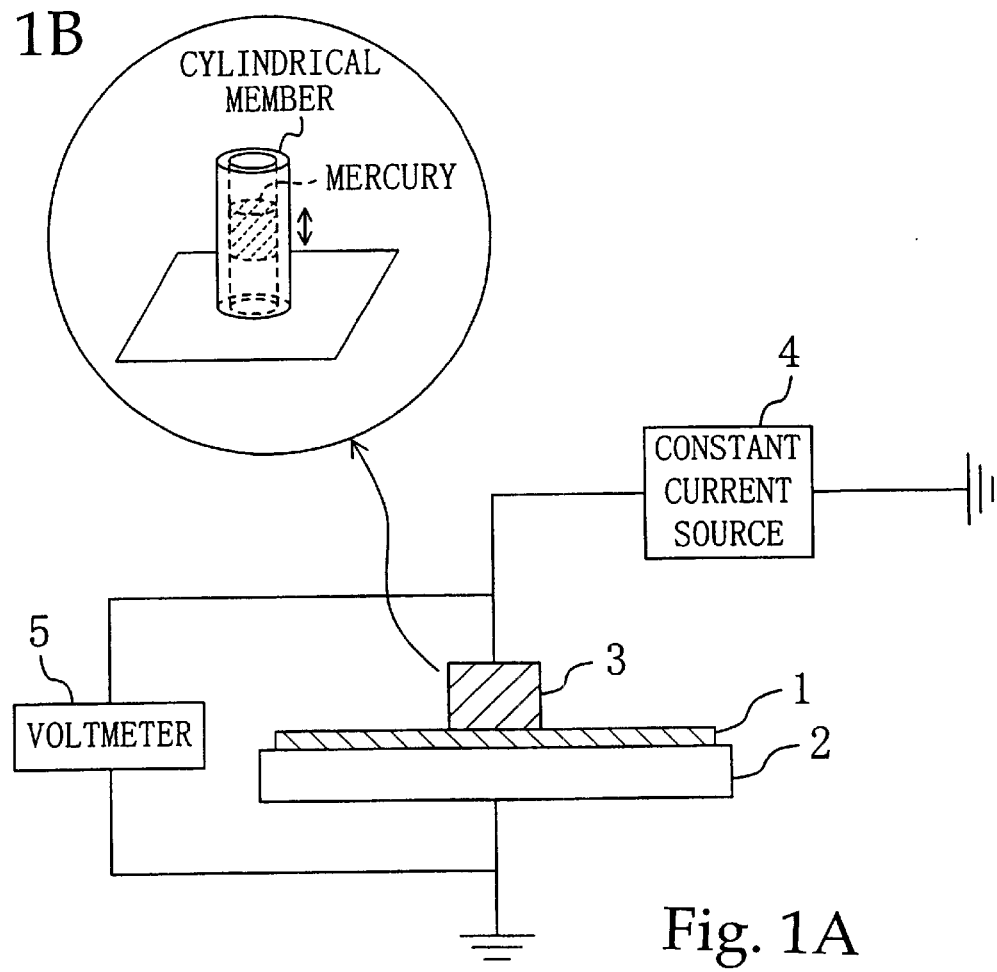
FIG. 1A is a schematic illustrating a method for evaluating face state of a semiconductor substrate according to a first embodiment of the present invention.
FIG. 1B is an enlarged view of the mercury electrode of FIG. 1A.
Figure 18:
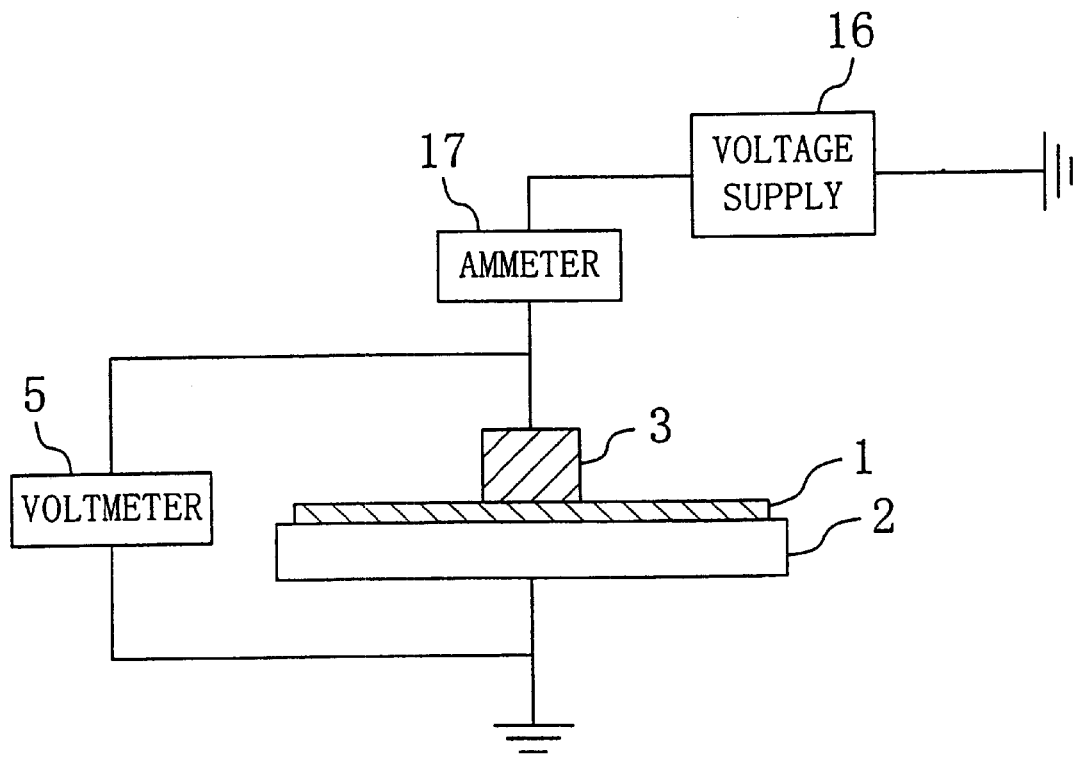
FIG. 18 is a schematic illustrating a conventional method for evaluating the surface state of a semiconductor substrate according to the I-V method.
Figure 19:
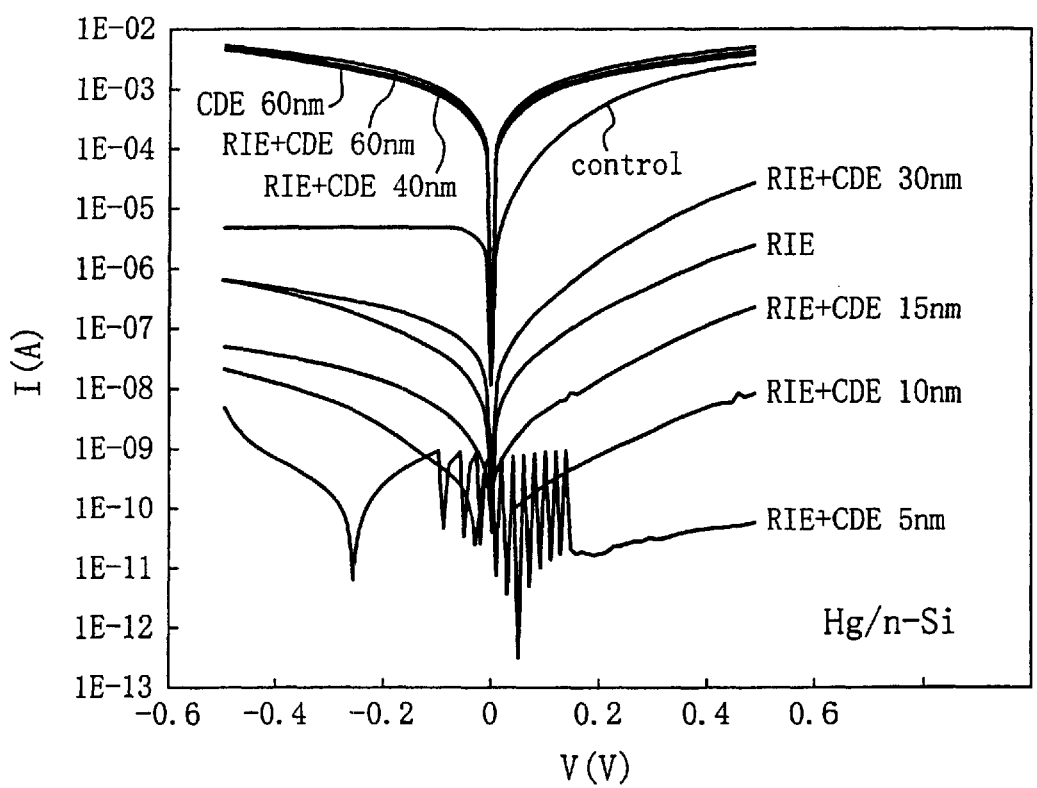
FIG. 19 is a graph illustrating I-V characteristics as results of evaluation on the surface state of a semiconductor substrate atom the I-V method.

FIGS. 1A and 1B illustrate a principle of measurement in a first exemplary embodiment of the present invention. As shown in FIG. 1A, an Si substrate 1, which is a target of measurement, is placed on a stage 2 of this measuring system. And a mercury electrode 3, which forms a Schottky barrier with the Si substrate 1, is in contact with the surface of the Si substrate 1. A constant current is supplied from a constant current source 4 between the Si substrate 1 and the mercury electrode 3. And a resultant variation in voltage with time is measured with a voltmeter 5. As can be seen, a constant current source is used in this embodiment unlike the conventional measuring system shown in FIG. 18.

Hereinafter, a method for evaluating the surface state of an Si substrate 1, which has been exposed to a plasma of the type increasing a contact resistance, will be described in this embodiment.

In this case, an n-type silicon wafer, of which the surface was a (100) crystallographic plane and the resistivity was 10 Ω·cm, was used as the Si substrate 1. A parallel-plate reactive ion etching (RIE) system was used to form a damaged layer within the substrate. A mixed gas of $CHF_3$ and $O_2$ was used as an etching gas, the pressure of the gas was set at 5 Pa, a radio frequency power of 1 kW was applied at 3.56 MHz.

Under these conditions, a damaged layer was formed within the Si substrate 1, which was then subjected to an $O_2$ down-flow plasma ashing process, and an organic compound deposited on the Si substrate 1 was removed therefrom. Subsequently, the Si substrate 1 was subjected to down-flow etching using a mixed gas of $CF_4$ and $O_2$, thereby partially removing a surface region of the Si substrate 1 by a depth of 5 to 60 nm (i.e., until a measurement point was reached). During this down-flow etching (also called "chemical dry etching (CDE)"), the pressure of the gas was 133 Pa and an RF power of 300 W was applied at 13.56 MHz.

Thereafter, the Si substrate 1 was subjected to ashing with $O_2$ plasma, cleaning with $H_2SO_4$ and $H_2O_2$ and then cleaning with diluted HF.

Then, using the arrangement shown in FIG. 1A, a constant current was supplied between the electrode 3 and substrate 1, thereby measuring a resulting variation in voltage with time. In this case, the mercury electrode 3, forming a Schottky barrier with the Si substrate 1, was brought into contact with the surface of the Si substrate 1. And a forward, constant current Ic0 was supplied between the substrate 1 and the electrode to measure a variation in voltage with time using the voltmeter 5. It should be noted that the mercury electrode 3 was formed by encapsulating mercury within a cylindrical member. During the measurement, mercury was lowered by the air pressure to come into contact with the target of measurement. And when the measurement was over, mercury was raised through vacuum pumping inside the cylindrical member.

Figure 2:
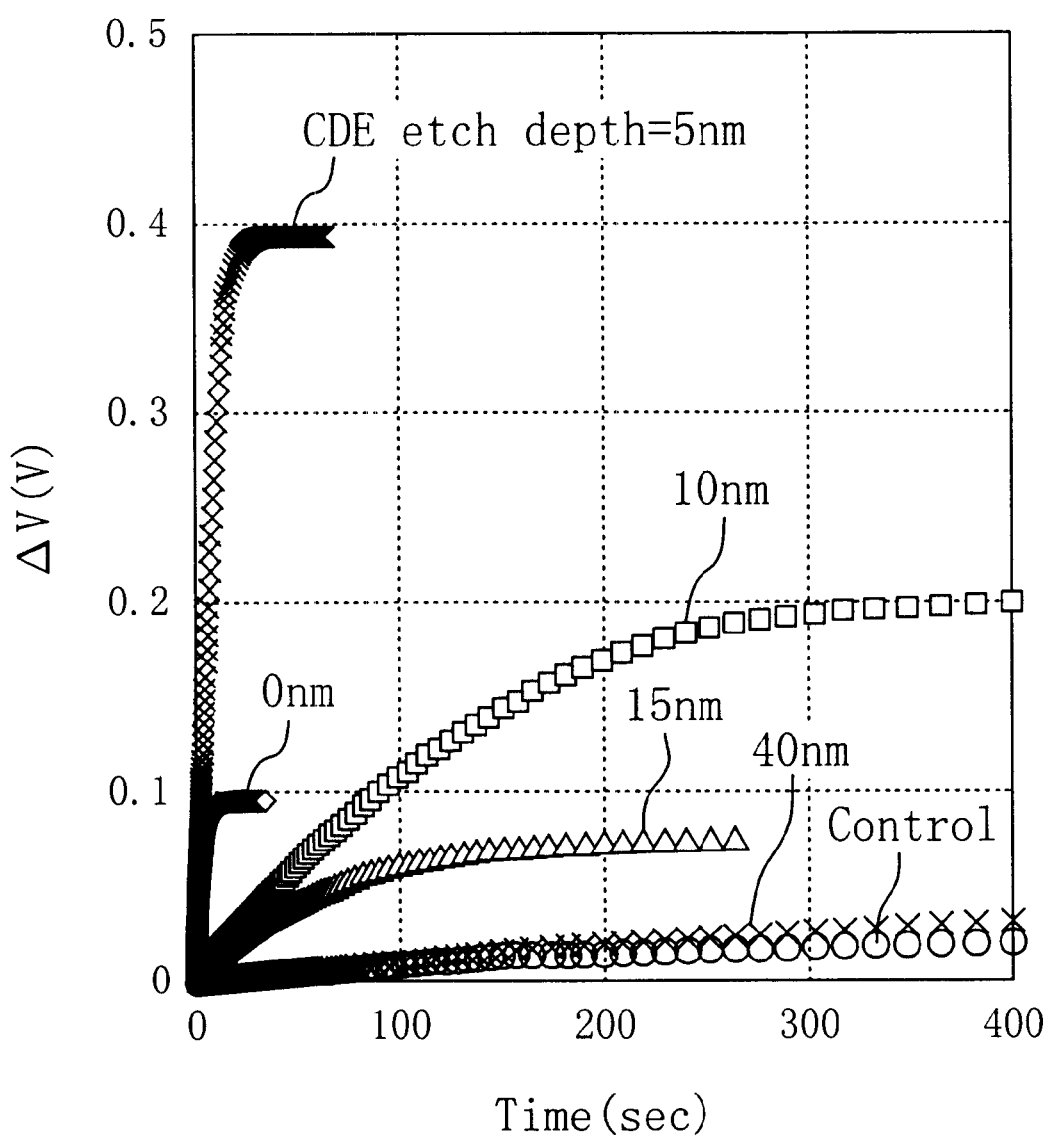
FIG. 2 is a graph illustrating the evaluated surface state of a semiconductor substrate in the first embodiment.

FIG. 2 illustrates a variation in voltage at the Si substrate 1 with time, where the constant current was defined at such a value as setting the initial voltage at 0.2 V. As shown in FIG. 2, the voltage at the damaged Si substrate 1 increases substantially linearly with the passage of time. When the CDE etch depth is 10 nm, this voltage reaches its maximum. However, when the etch depth reaches 15 nm, the voltage drastically decreases. And when the etch depth is 40 nm, the voltage is almost equal to the "control" level.

That is to say, based on the relationship between the saturation value of the variation $\Delta V$ in voltage with time and the etch depth where a constant current was supplied as shown in FIG. 2, it is expected that a large number of defects, etc., affecting the variation $\Delta V$ in voltage with time, exist in a surface region of the Si substrate 1 at a depth of approximately 5 to 10 nm as measured from the surface thereof.

Thus, the present inventors suggest the following models to give a reasonable explanation for the occurrence of such a variation $\Delta V$ in voltage with time.

Figure 3A:
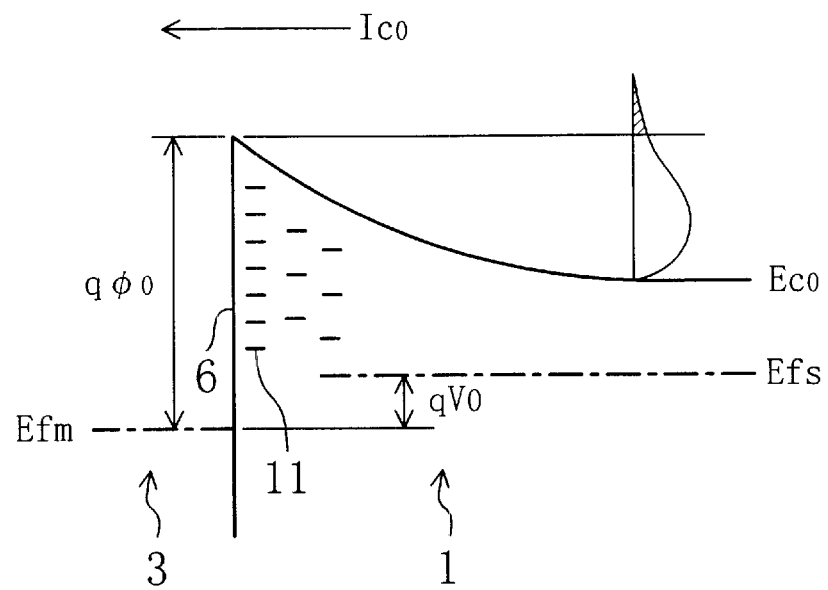
FIGS. 3(a) and 3(b) illustrate models for the evaluating method in the first embodiment.
Figure 3B:
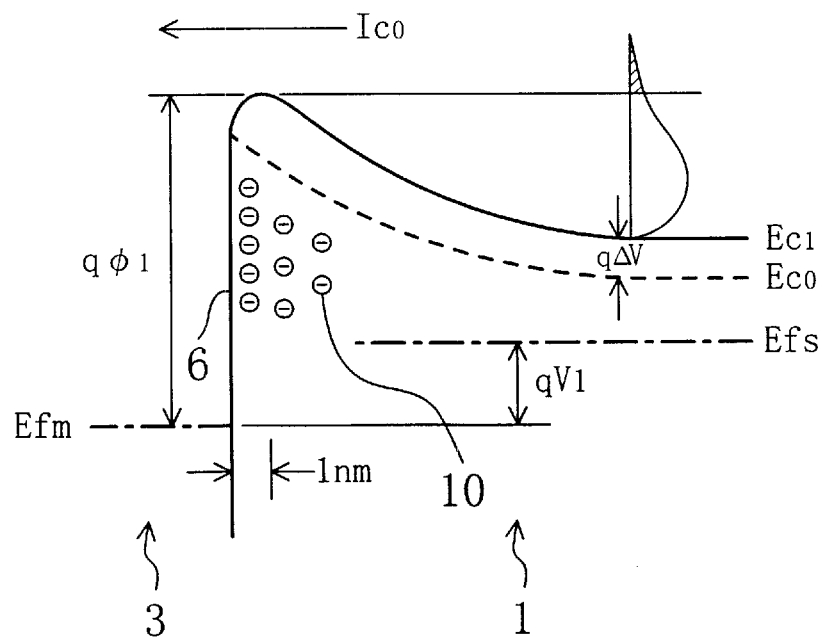

FIGS. 3(a) and 3(b) are energy band diagrams illustrating how the energy bands change in the n-type Si substrate 1 and mercury electrode 3. In this case, the mercury electrode 3, forming a Schottky barrier 6 with the substrate 1, was brought into contact with the surface of the substrate 1 and a forward constant current Ic0 was supplied between the substrate 1 and the electrode 3.

In the initial state shown in FIG. 3(a), when the substrate 1 and electrode 3, which form a Schottky barrier of a specific height $q\phi_0$, are brought into contact with each other, the Fermi level Efs of the substrate 1 matches with the Fermi level Efm of the electrode 3. And when a positive initial voltage $V_0$ is applied to the electrode 3 to make a forward current flow between the substrate 1 and the electrode 3, the Fermi level Efs of the substrate 1 gets higher than the Fermi level Efm of the electrode 3 by $qV_0$. However, the height of the barrier 6 therebetween is still $q\phi_0$. Then, a current Ic0 flows from the substrate 1 toward the electrode 3 in accordance with a difference between the energy level Ec0 on the conduction band of the substrate 1 and that at the upper edge of the Schottky barrier 6.

Thereafter, if the constant current Ic0 is continuously supplied, then charges 10 are injected into the trap centers 11 within the substrate 1 as shown in FIG. 3(b). In accordance with the quantity of these charges 10 injected, the energy level on the conduction band of the substrate 1 rises near the surface thereof. As a result, the height of the Schottky barrier 6 also increases to $q\phi_1$. In this case, the effective Schottky barrier height $q\phi_1$, is limited to the highest potential of the energy level Ec1 on the conduction band of the substrate 1 near the surface thereof (i.e., where the centers 11 are located). And if a voltage is continuously applied to make the constant current Ic0 flow even after the effective Schottky barrier height has increased to $q\phi_1$, both the Fermi level Efs of the substrate 1 and the energy level Ec1 on the conduction band are also raised in a deeper region of the substrate 1. This variation $(qV_1 - qV_0)$ of the Fermi level Efs corresponds to the variation $\Delta V$ in voltage. Finally, when the trap centers 11 are saturated with the charges 10, the variation $\Delta V$ in voltage shown in FIG. 2 becomes constant.

In general, the Poisson's equation is represented as the following Equation (1):

$$dV/dx = \rho/\in \quad (1)$$

where x is a distance in the depth direction within an Si substrate 1, ρ is a quantity of charges and ∈ is a relative dielectric constant of the substrate 1.

Supposing the charge trap centers are located at a depth of 1 nm as measured from the surface of the Si substrate 1 and neglecting tunneling (because the current flows forward at room temperature), the present inventors derived the following Equation (2) for calculating a defect density N at a charge-trapping level from the variation ΔV in voltage by expanding the Poisson's Equation.

$$\Delta V = \chi \cdot qN/\in \quad (2)$$

where ΔV is a variation in voltage in a saturation state, ∈ is a relative dielectric constant of the Si substrate 1, N is a defect density, q is a quantity of charges and χ is the depth of the charge trap center.

Figure 4:
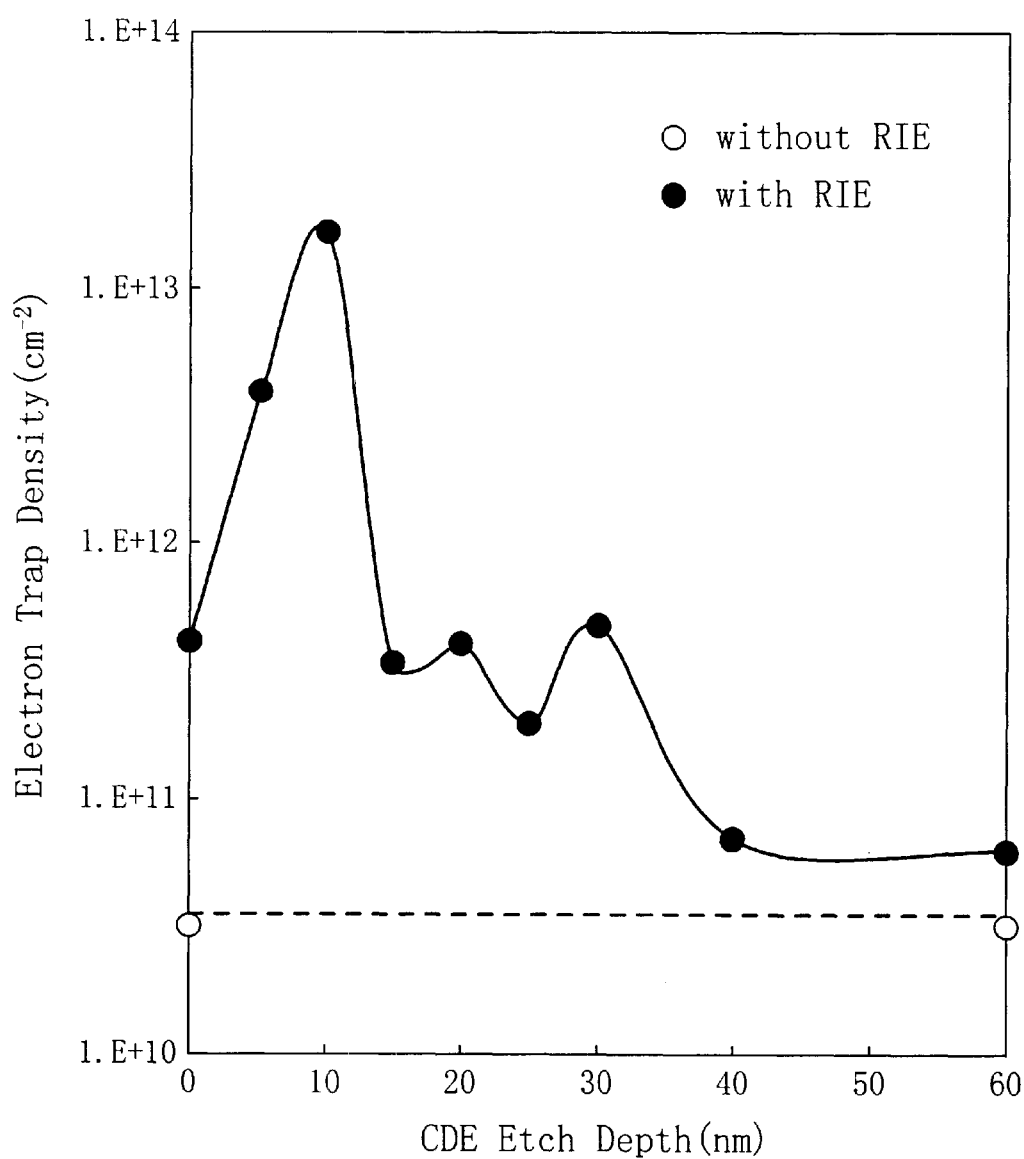
FIG. 4 is a graph illustrating an estimated distribution of defect density in the depth direction within the surface of a semiconductor substrate in the first embodiment.

FIG. 4 illustrates a distribution of defect density calculated based on Equation (2) using the saturation value of the variation ΔV in voltage shown in FIG. 2. It should be noted that χ is supposed to be 1 nm in this embodiment. Also, as indicated by the solid circles ● in FIG. 4, the same number of samples as that of these circles were prepared and the etch depth as measured from the surface of the substrate was changed in units of 5 nanometers. As shown in FIG. 4, the defect density N reached its maximum of $1 \times 10^{13}$ cm$^{-2}$ or more when the etch depth was 10 nm. However, when the depth was 15 nm, the density drastically decreased to a value between $1 \times 10^{11}$ cm$^{-2}$ and $1 \times 10^{12}$ cm$^{-2}$. And when the depth was 40 nm, the substrate had almost completely recovered from defects.

Following is the points to be noted.

Firstly, it can be seen that two peaks of defect density were formed in respective regions where the depths were around 10 nm and around 30 nm, respectively. This is probably because carbon and hydrogen were used in this experiment as respective seeds for plasma. That is to say, although the carbon seed reaches a relatively shallow region within the substrate, the hydrogen seed can reach a relatively deep region within the substrate.

Figure 20:
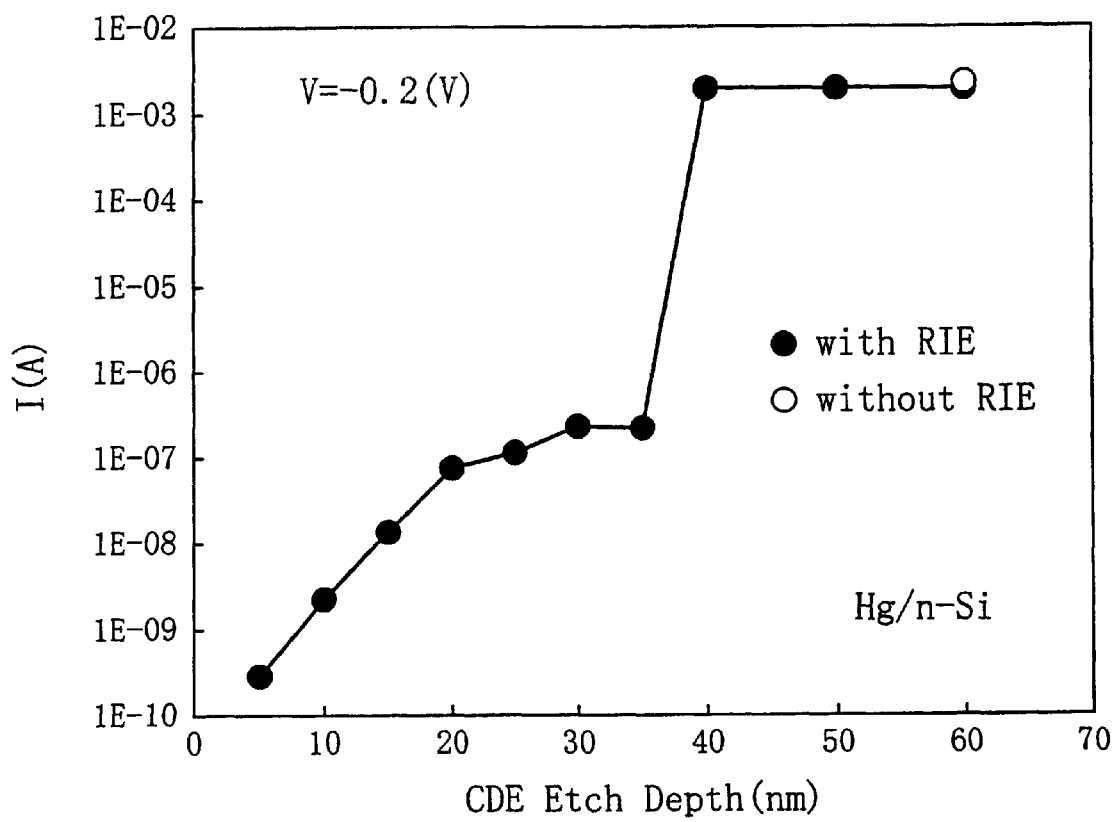
FIG. 20 is a graph illustrating a distribution of an etch-induced damaged layer in the depth direction within the surface of a semiconductor substrate according to the I-V method.

Secondly, although this experiment also tells us that the damage reached a depth of 40 nm as in the results of conventional I-V evaluation shown in FIG. 20, it was newly found by this experiment that the trap density at a depth of about 10 nm was very high. It seems that trapping was caused at such a depth by the carbon seeds with a large atomic radius. It can also be seen that the trap densities at the depths of 15 to 40 nm were very low.

Figure 5:
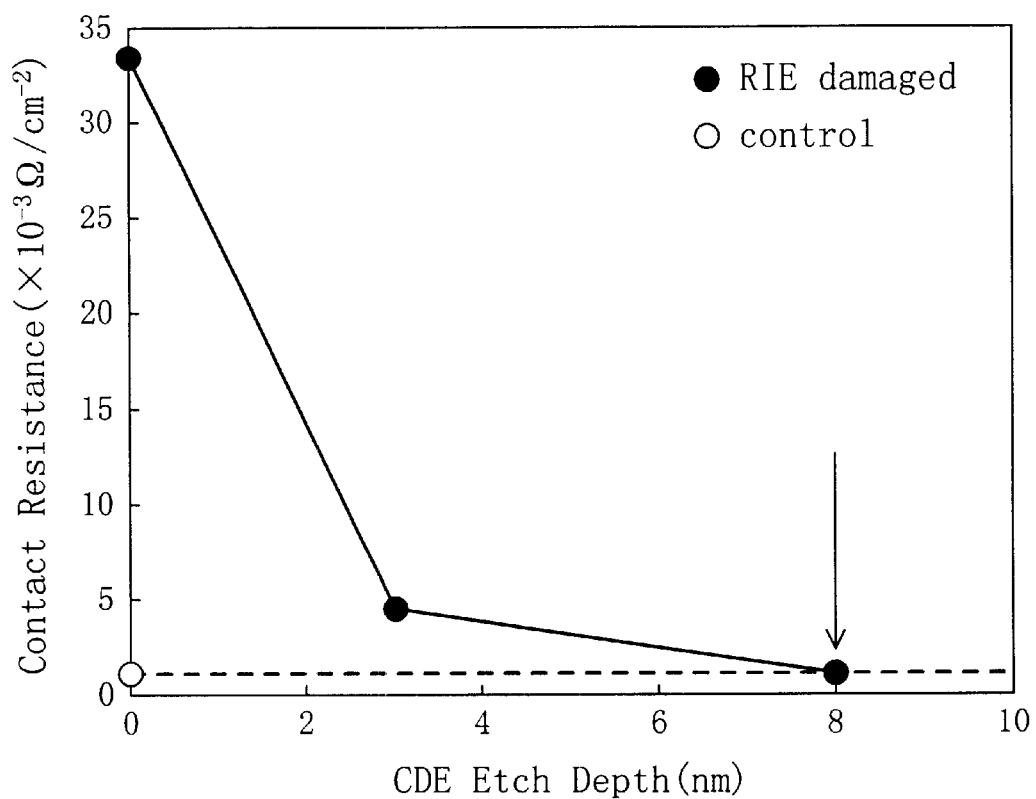
FIG. 5 is a graph illustrating a relationship between the etch depth of a semiconductor substrate and the contact resistance of a device formed thereon in the first embodiment.

This depth of 10 nm is substantially equal to a desired etch depth of 8 nm, which is required for reducing the contact resistance as shown in FIG. 5. That is to say, only if such a defect region with a high trap density as that caused by the carbon seed is removed, a defect region with a low trap density like that caused by the hydrogen seed does not have to be removed. According to the conventional I-V measurement, however, even a region with a very low trap density is also detected as an integral part of the damaged layer, because the level of the trap density cannot be precisely distinguished by such a method. That is to say, according to the conventional I-V method, it is very difficult to detect a CDE endpoint during the fabrication process of semiconductor devices. Thus, according to the conventional method, a contact resistance should be measured after the devices have been formed, and a correlation between the contact resistance and the etch depth should be separately defined in advance. And then the CDE etch depth of a semiconductor substrate should be determined empirically based on the correlation defined.

In contrast, the shallower defect site detected by the evaluating method of the present invention indicated a good correlation with an adequate etch depth derived by measuring the contact resistance. Accordingly, the technique of the present invention is applicable to controlling a fabrication process. That is to say, if a correlation between a depth, where a desired contact resistance is attained, and a trap density is defined beforehand based on the diffusion state of impurities within a substrate and the conductivity type thereof, then an optimum etch depth can be detected very accurately. Thus, in this embodiment, a measuring terminal, forming a Schottky barrier with a semiconductor substrate, is brought into contact with the substrate, and a forward current is supplied between the substrate and the terminal. After the current has been stabilized at a constant value, a variation in voltage with time is measured, and a saturation value thereof is obtained. In this manner, the surface state of the substrate can be evaluated accurately, the depth, where a damaged layer large enough to affect the electrical characteristics of resulting devices exists, can be detected, and a CDE process for the removal of the damaged layer can be performed adequately.

It should be noted that the data shown in FIG. 4 was obtained by CDE-etching an Si substrate in units of 5 nanometers. Alternatively, the Si substrate may be etched in units of 3 nanometers. According to the evaluation technique of the present invention, a defect density at a depth of several nanometers as measured from the surface of a substrate can be estimated with high sensitivity. Thus, by preparing the same number of samples as that of various etch depths defined for the damaged layer, the distribution of defect density within the damaged layer can be estimated in the depth direction in the substrate.

MODIFIED EXAMPLE OF EMBODIMENT 1

In the first embodiment, an n-type Si substrate with a damaged layer increasing a contact resistance is used as the Si substrate 1. Alternatively, any other semiconductor substrate may be used instead and the substrate may be in any arbitrary state. Also, the measuring terminal does not have to be a mercury electrode.

Moreover, in the first embodiment, a constant current is supplied as one of the electrical stresses, and a variation in voltage, or the other electrical stress, is measured. Alternatively, a constant voltage may be applied as one of the electrical stresses, and a variation in current may be measured as that of the other electrical stress. In such a case, when the electrons 10 are trapped at the centers 11 in the state shown in FIG. 3(*a*), only a potential near the boundary rises in the energy level Ec0 on the conduction band of the Si substrate 1. However, since the voltage is constant, the energy level difference between the Fermi level Efm of the mercury electrode 3 and the Fermi level Efs of the substrate 1 remains qV$_0$. And the energy level Ec1 on the conduction band of the Si substrate 1 shown in FIG. 3(*b*) does not change as to the potential in the deeper region. Accordingly, the potential difference in energy level Ec1 on the conduction band of the substrate 1 increases with time between the deeper region and the boundary region thereof shown in FIG. 3(*b*), while the amount of current gradually decreases. Thereafter, the current substantially stops decreasing and is stabilized at an approximately constant value. A variation in current at that point in time corresponds to a variation ΔV in voltage with time according to the first embodiment.

In the first embodiment and this modified example, a current is supposed to flow from the Si substrate 1 toward the mercury electrode 3. Alternatively, the variation may be measured by making the current flow in the opposite direction, i.e., from the electrode 3 toward the substrate 1.

In the foregoing embodiment and example, an n-type Si substrate 1 is used. Alternatively, a p-type semiconductor substrate may also be used. In such a case, holes are trapped in the damaged layer. Since the potential changes similarly on the valence band of the semiconductor substrate, the depth and degree of the damaged layer, corresponding to the defect density, can be measured quantitatively based on the variation in hole current.

Also, according to the I-V measurement of the present invention, not only the measuring terminal forming a Schottky barrier with a semiconductor substrate, but also a terminal making an ohmic contact with the substrate may be used. Even then, it is possible to determine whether or not a defect density high enough to cause a problem in practice exists based on a variation in voltage or current resulting from (either positive or negative) charge trapping at the centers within the semiconductor substrate.

EMBODIMENT 2

In a second exemplary embodiment of the present invention, a method for quantitatively evaluating damage with an oxide film (preferably, a thin oxide film enabling charge tunneling) intentionally formed on a semiconductor substrate will be described.

FIGS. 6(a) through 6(d) are cross-sectional views illustrating how a sample is prepared to carry out an evaluating method according to the second embodiment.

Figure 6A:
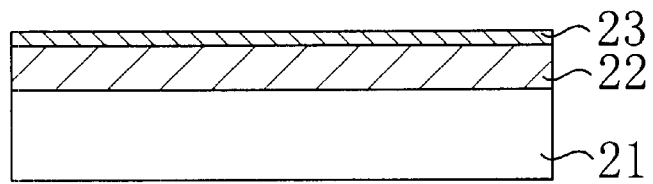
FIGS. 6(a), 6(b), 6(c) and 6(d) are cross-sectional views illustrating how a sample is prepared to carry out an evaluating method according to a second embodiment of the present invention.

First, in the process step shown in FIG. 6(a), an n-type Si substrate 21, of which the surface is a (100) crystallographic plane and the resistivity is 10 Ω·cm, is etched with a parallel-plate RIE system to form a damaged layer 22 within the substrate 21. A mixed gas of $CHF_3$ and $O_2$ is used as an etching gas, the pressure of the gas is set at 5 Pa, a radio frequency power of 1 kW is applied at 13.56 MHz. In this case, an organic deposited film 23 is also formed on the substrate 21.

Figure 6B:
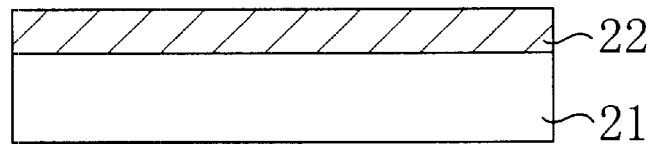

Next, in the process step shown in FIG. 6(b), the substrate is subjected to an $O_2$ down-flow plasma ashing process, thereby removing the organic film 23 deposited on the Si substrate 21.

Figure 6C:
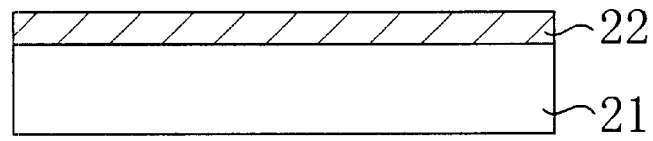

Subsequently, in the process step shown in FIG. 6(c), the substrate is subjected to down-flow etching using a mixed gas of $CF_4$ and $O_2$ thereby removing the damaged layer 22 to a desired depth at which measurement should be performed (e.g., somewhere between 5 and 60 nm). During this down-flow etching (also called "chemical dry etching (CDE)"), the pressure of the gas is 133 Pa and an RF power of 300 W is applied at 13.56 MHz. Thereafter, the Si substrate is subjected to ashing with $O_2$ plasma, cleaning with $H_2SO_4$ and $H_2O_2$ and cleaning with diluted HF.

Figure 6D:
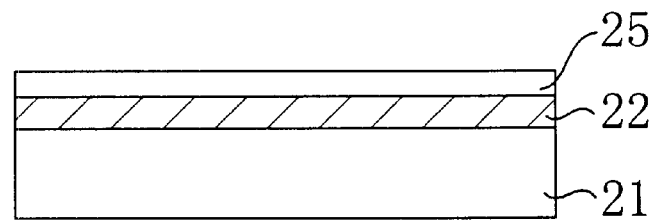

Then, in the process step shown in FIG. 6(d), a thin oxide film 25 is formed to be 3 to 4 nm thick by a downstream remote plasma oxidation (RPO) technique. In this case, the oxidation is conducted at 400° C. or less such that the crystallinity of the damaged layer 22 within the Si substrate 21 does not recover.

Figure 7:
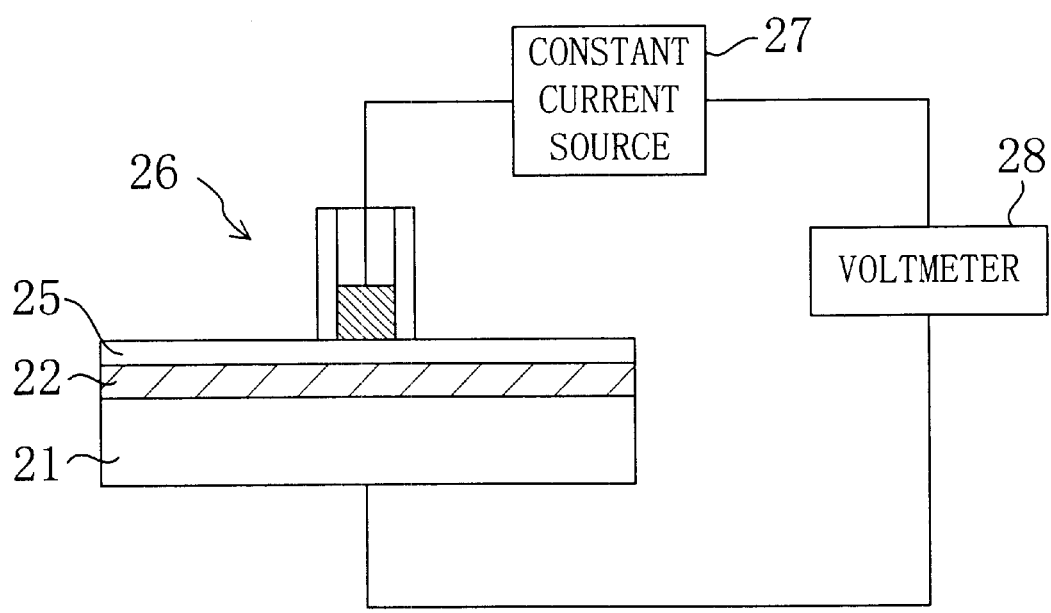
FIG. 7 is a schematic illustrating a method for evaluating the surface state of a semiconductor substrate in the second embodiment.

FIG. 7 schematically illustrates a measuring method in this embodiment. As shown in FIG. 7, a mercury electrode 26, which is a measuring terminal, is in contact with the oxide film 25 on the Si substrate 21. A constant current is supplied from a constant current source 27 between the substrate 21 and the electrode 26. And a resultant variation in voltage is measured with a voltmeter 28. The mercury electrode 26 also consists of a cylinder member and mercury encapsulated within the cylinder. Although the Si substrate 21 is actually placed on a stage as in the first embodiment, the illustration of the stage is omitted in FIG. 7.

FIGS. 8(a), 9(a), 10(a) and 11(a) illustrate respective energy band diagrams showing an estimated variation in energy states of the damaged layer 22 and Si substrate 21 where a constant current Ic0 is supplied between the mercury electrode 26 and the substrate 21 and where the oxide film 25 is formed on the substrate 21. FIGS. 8(b), 9(b), 10(b) and 11(b) illustrate respective distributions of trapped electrons.

Figure 8A:
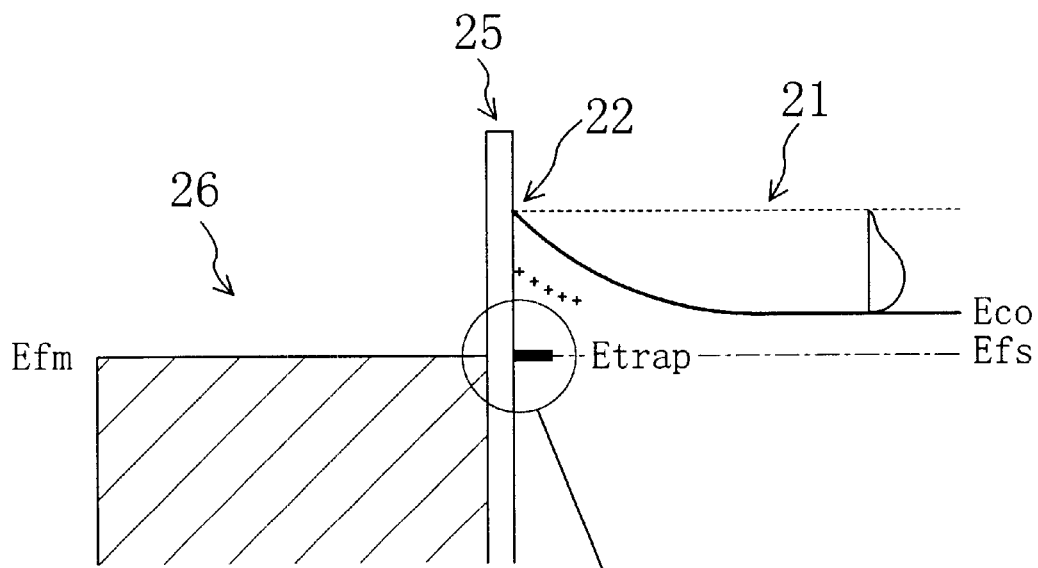
FIGS. 8(a) and 8(b) illustrate an energy band diagram where no voltage is applied between a mercury electrode and an Si substrate, along with the density of states of electrons trapped around the interface between the electrode and the substrate, and a region the trapped electrons exist.
Figure 8B:
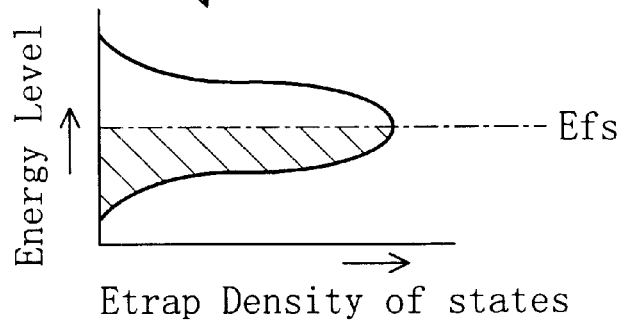

FIG. 8(a) illustrates an energy band diagram where no voltage is applied between the mercury electrode 26 and the Si substrate 21. FIG. 8(b) illustrates a density of states (by a contour line) of electrons trapped around the interface between the oxide film 25 and the substrate 21 shown in FIG. 8(a) and a region where the trapped electrons exist (by hatching).

As shown in FIG. 8(a), with no voltage applied, the Fermi level Efm of the mercury electrode 26 matches with the Fermi level Efs of the Si substrate 21. And as shown in FIG. 8(b), almost all trapped electrons exist at respective energy levels lower than the Fermi level Efs, and it seems that substantially no trapped electrons exist at energy levels higher than the Fermi level Efs.

Figures 9A, 9B:
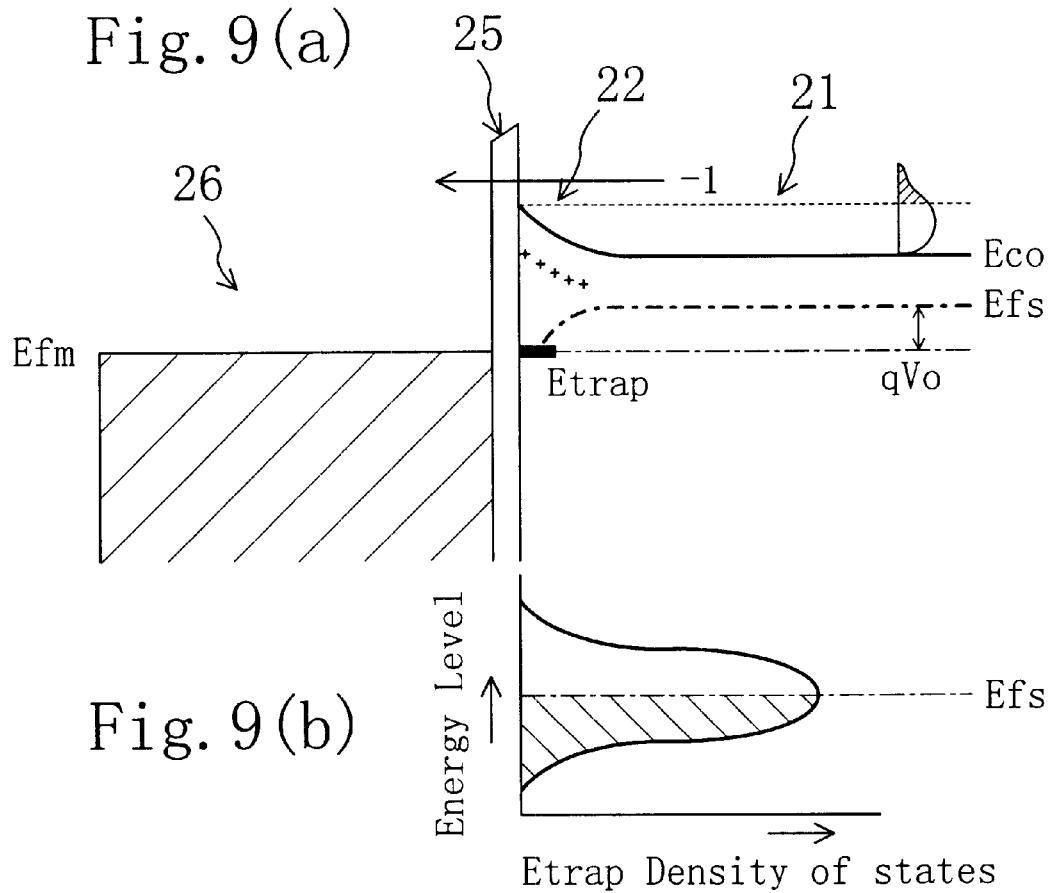
FIGS. 9(a) and 9(b) illustrate an energy band diagram where an initial voltage $V_0$ has been applied between the mercury electrode and the Si substrate, along with the density of states of electrons trapped around the interface between the electrode and the substrate, and a region where the trapped electrons exist.

FIG. 9(a) illustrates an energy band diagram where an initial voltage $V_0$ is applied between the mercury electrode and the Si substrate 21 such that a constant current Ic0 flows therebetween. FIG. 9(b) illustrates a density of states (by a contour line) of electrons trapped around the interface between the oxide film 25 and the substrate 21 shown in FIG. 9(a) and a region where the trapped electrons exist (by hatching).

As shown in FIG. 9(a), when a positive initial voltage $V_0$ (of about 0.2 V) is applied to the mercury electrode 26 such that the constant current Ic0 flows, the Fermi level Efs of the substrate 21 gets higher than the Fermi level Efm of the electrode 26 by $qV_0$. And as shown in FIG. 9(b), almost all trapped electrons also exist at respective energy levels lower than the Fermi level Efs, and it seems that substantially no trapped electrons exist at energy levels higher than the Fermi level Efs. It should be noted that the current value Ic0 is believed to represent a sum of electrons passing (or tunneling) through the oxide film 25 and electrons trapped.

Figure 10A:
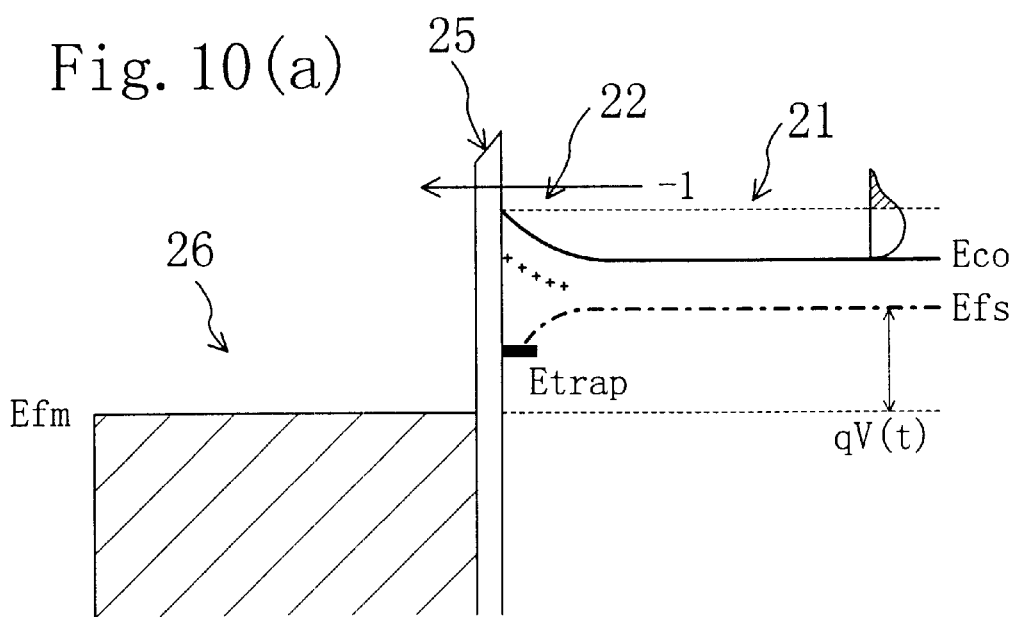
FIGS. 10(a) and 10(b) illustrate an energy band diagram where a voltage V(t) variable with time has been applied between the mercury electrode and the Si substrate, along with the density of states of electrons trapped around the interface between the electrode and the substrate, and a region where the trapped electron exist.
Figure 10B:
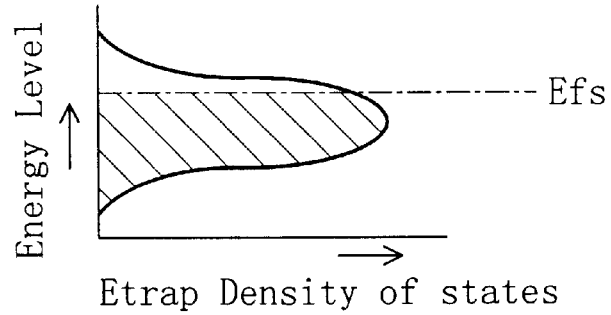

FIG. 10(a) illustrates an energy band diagram where a voltage V(t) variable with time is applied between the mercury electrode 26 and the Si substrate 21 such that the constant current Ic0 flowing therebetween is maintained. FIG. 10(b) illustrates a density of states (by a contour line) of electrons trapped around the interface between the oxide film 25 and the substrate 21 shown in FIG. 10(a) and a region where the trapped electrons exist (by hatching).

As shown in FIG. 10(a), as the traps are filled with the larger number of electrons, the voltage V(t) applied to the mercury electrode 26 increases correspondingly. As a result, the Fermi level Efs of the Si substrate 21 gets higher than the Fermi level Efm of the mercury electrode 26 by qV(t). In this case, the larger the number of trapped electrons occupying the total energy area where the trapped electrons can exist (i.e., the area surrounded by the contour line), the narrower the vacant area as shown in FIG. 10(b). Even in such a state, however, these trapped electrons also exist at respective energy levels lower than the Fermi level Efs, and it seems that substantially no trapped electrons exist at energy levels higher than the Fermi level Efs.

Figure 11A:
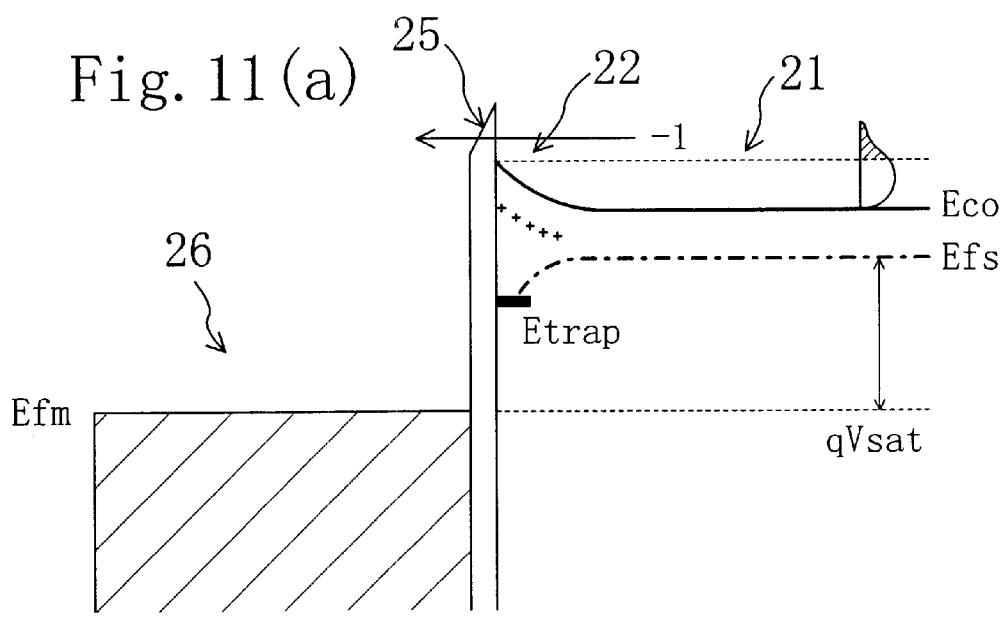
FIGS. 11(a) and 11(b) illustrate an energy band diagram where a saturated voltage Vsat has been applied between the mercury electrode and the Si substrate, along with the density of states of electrons trapped around the interface between the electrode and the substrate, and a region where the trapped electrons exist.
Figure 11B:
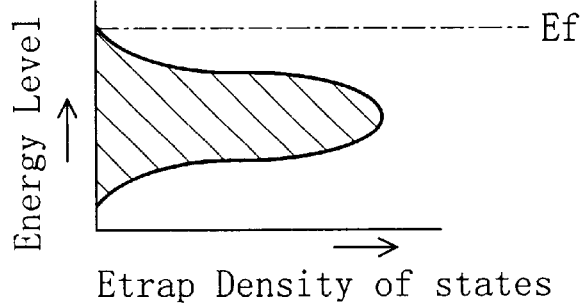

FIG. 11(a) illustrates an energy band diagram where the voltage V(t) applied to maintain the constant current Ic0 flowing between the mercury electrode 26 and the Si substrate 21 has reached a saturated voltage Vsat. FIG. 11(b) illustrates a density of states (by a contour line) of electrons trapped around the interface between the oxide film 25 and the substrate 21 shown in FIG. 11(a) and a region where the trapped electrons exist (by hatching).

In this case, the constant current Ic0 shown in FIG. 11(a) seems to be caused almost only by the electrons tunneling through the oxide film 25. That is to say, as shown in FIG. 11(b), once the saturated voltage Vsat has been reached, there are no traps accepting charges anymore. Accordingly, almost all the energy area, where the trapped electrons can exist, should have been occupied by the trapped electrons.

That is to say, as shown in FIGS. 9(b), 10(b) and 11(b), although the Fermi level Efs of the Si substrate 21 gets higher as the voltage V(t) rises, it seems that the Fermi level Efs cannot exceed the energy level Etrap of the trapped electrons. In other words, the Fermi level Efs is "pinned" to the energy level Etrap of the trapped electrons so to speak.

Thus, if the oxide film 25 is formed on the Si substrate 21 and the mercury electrode 26 is brought into contact with the oxide film 25 as in this embodiment, the Fermi level Efs of the Si substrate 21 is as it were "pinned" by the trapped electrons. Accordingly, in order to maintain the constant current Ic0, a higher voltage V(t) should be applied in view of this pinning. That is to say, the measuring sensitivity can be improved.

Figure 12:
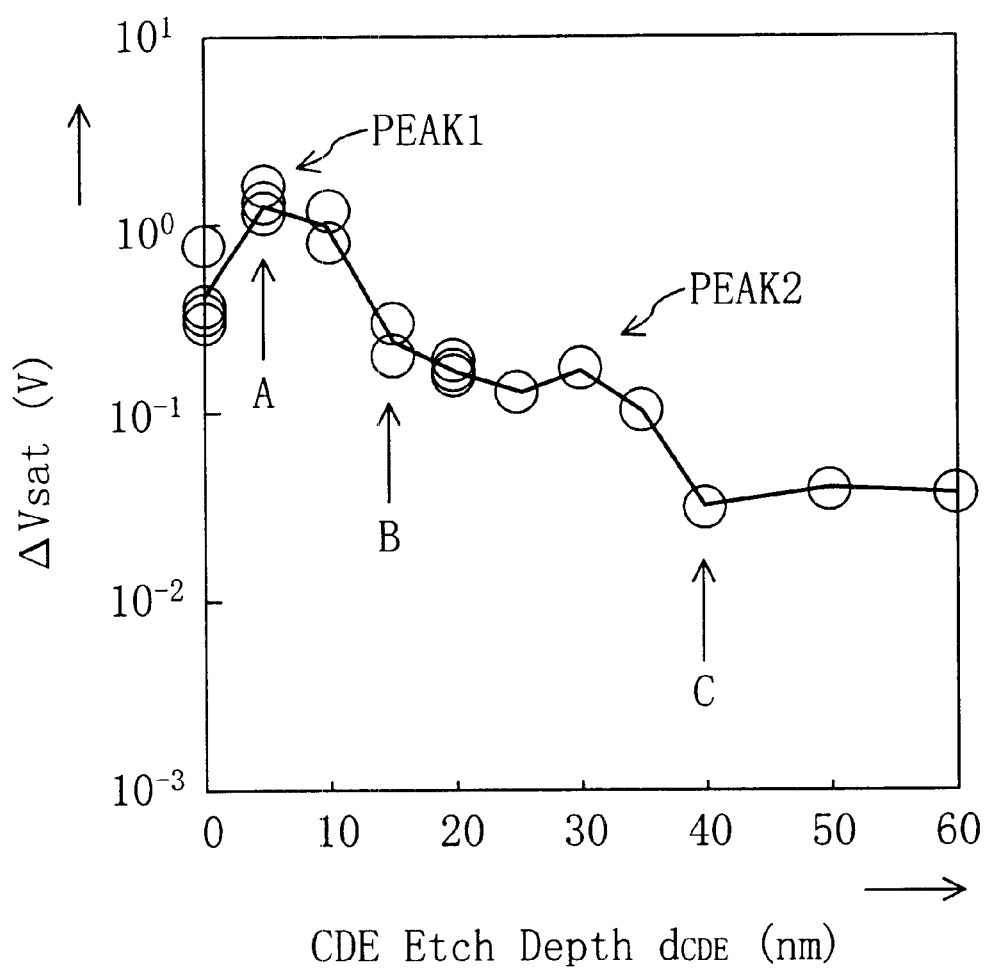
FIG. 12 is a graph illustrating a relationship between the etch depth and a variation $\Delta$Vsat in saturated voltage in the second embodiment.
Figure 13:
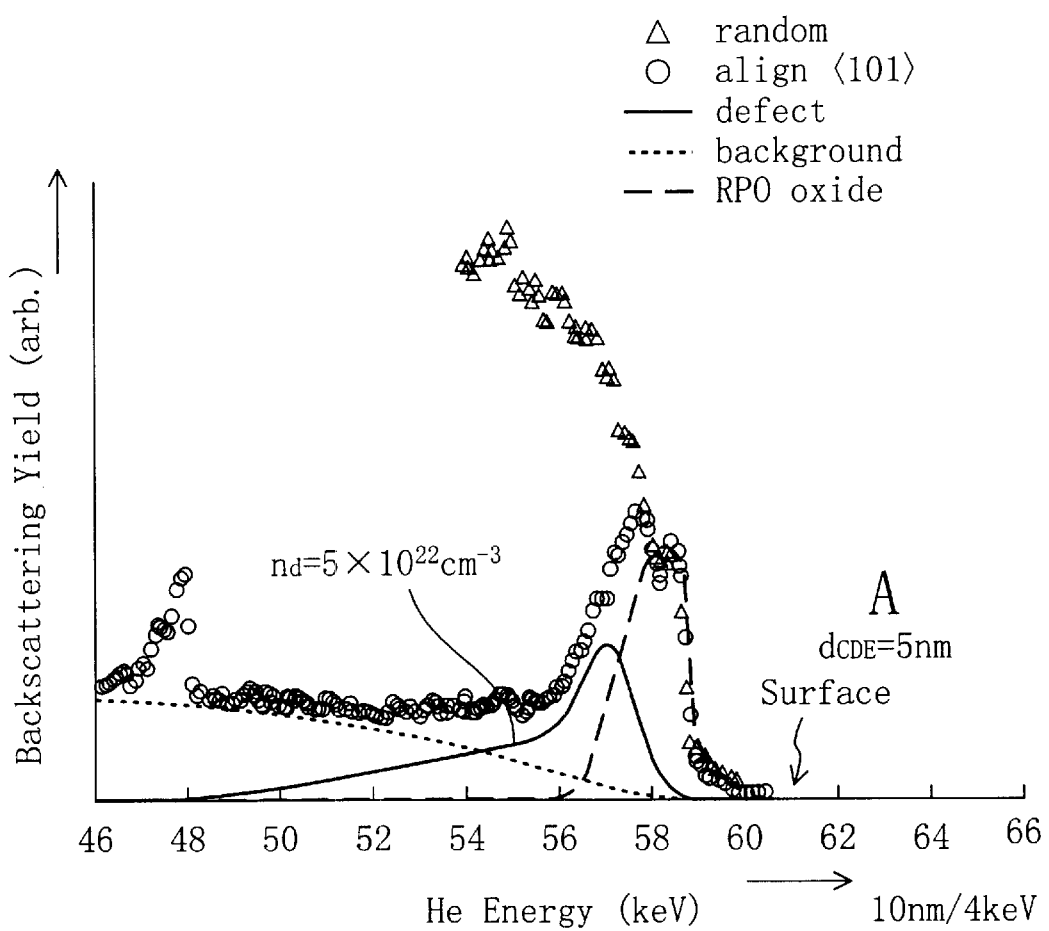
FIG. 13 is a illustrating a result of an RBS measurement a defect density $_{nd}$ at a point A (depth: 5 nm) shown in FIG. 12.
Figure 14:
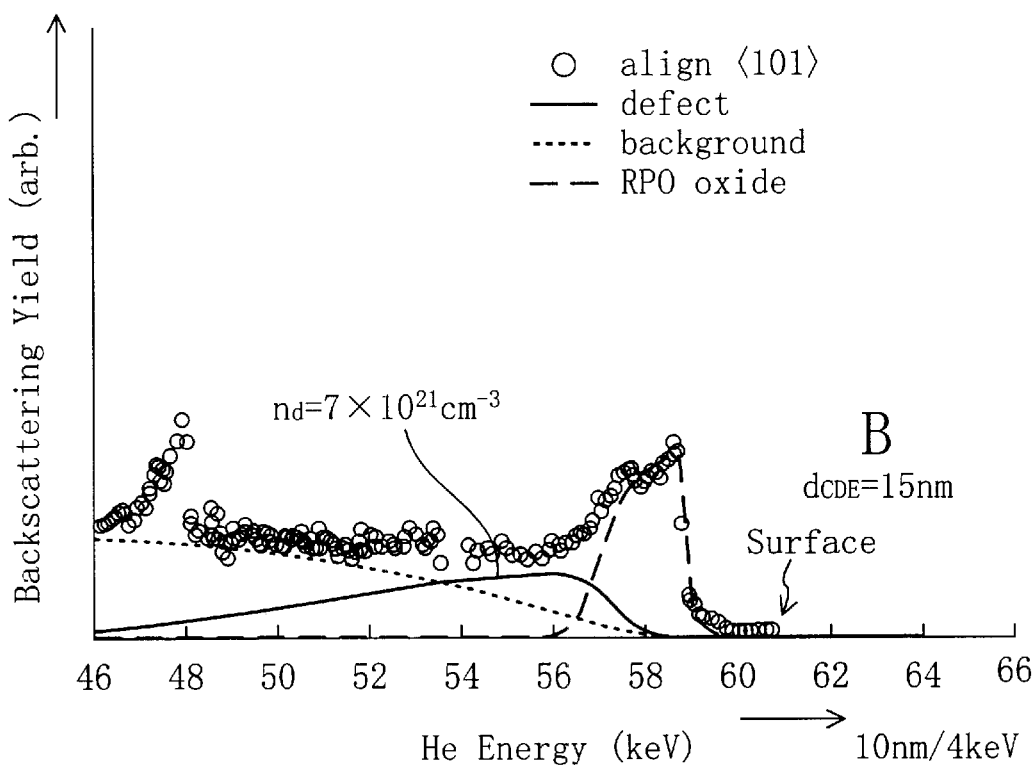
FIG. 14 is a graph illustrating a result of an RBS measurement of a defect density $n_d$ at a point B (depth: 15 nm) shown in FIG. 12.
Figure 15:
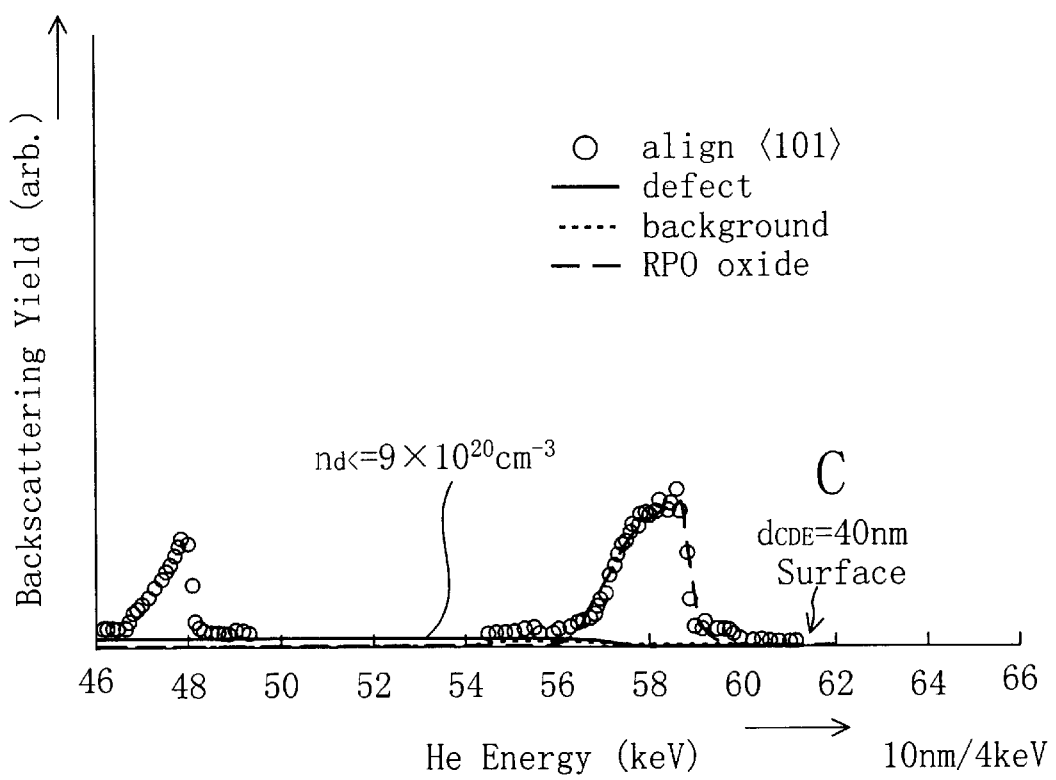
FIG. 15 is a graph illustrating a result of an RBS measurement of a defect density $n_d$ at a point C (depth: 40 nm) shown in FIG. 12.

FIG. 12 illustrates data about a relationship between the etch depth and a variation ΔVsat in saturated voltage in the second embodiment. In FIG. 12, the axis of abscissas represents a CDE etch depth $d_{CDE}$ and the axis of ordinates represents a variation ΔVsat in saturation voltage Vsat. FIG. 13 through 15 illustrate defect densities measured by Rutherford Backscattering Spectrometry (RBS) at respective points A (at a depth of 5 nm), B (at a depth of 15 nm) and C (at a depth of 40 nm) shown in FIG. 12. In FIGS. 13 through 15, the axis of abscissas represents energy of He atoms impinged onto, and scattered by, the Si substrate 21, while the axis of ordinates represents a backscattering (or median ion scattering (MEIS)) intensity representing a yield. Also, the open triangles Δ indicate the scattering intensity of the He atoms resulting from He ions that have impinged on the crystal lattice of Si and the open circles ○ indicate the scattering intensity of the He atoms resulting from He ions that have impinged vertically to the <101> axis of the Si substrate. He ions are bombarded at an accelerating voltage of 80 keV. The scattering spectra shown in FIGS. 13 through 15 are analyzed by Monte Carlo simulation to obtain the distributions of Si atoms in the defect regions as indicated by the solid-line curves in these drawings. In this manner, the defect densities $n_d$ at a depth of about 1 nm from the interface between $SiO_2$ and Si were obtained as shown in FIGS. 13 through 15.

As shown in FIGS. 13, 14 and 15, the defect densities $n_d$ at the depths of 5 nm, 15 nm and 40 nm are $5\times10^{22}$ cm$^{-3}$, $7\times10^{21}$ cm$^{-1}$ and $<9\times10^{20}$ cm$^{-3}$ respectively.

Figure 16:
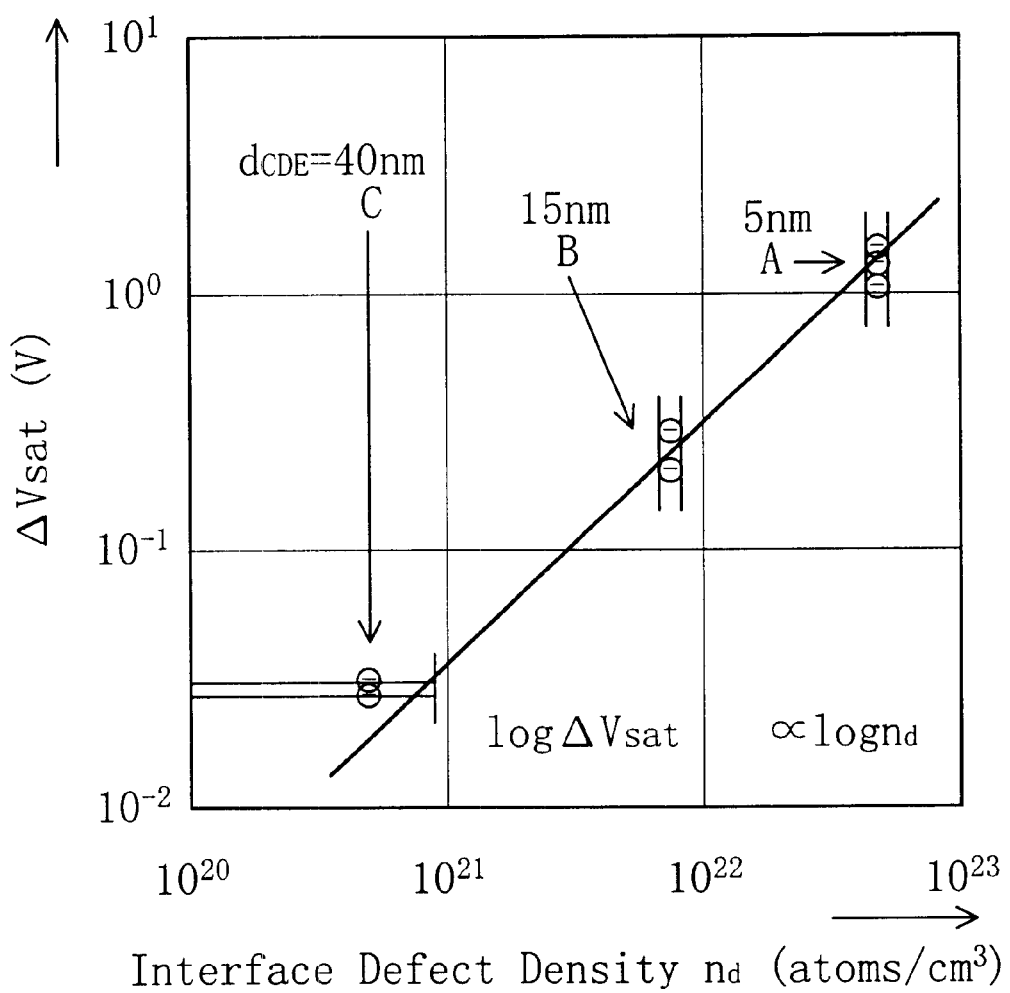
FIG. 16 is a graph illustrating a relationship between the defect density $n_d$ and a variation $\Delta$Vsat in saturated voltage based on the data shown in FIGS. 13 through 15.

FIG. 16 illustrates a relationship between the defect density $n_d$ and a variation ΔVsat in saturated voltage, which was obtained based on the data shown in FIGS. 13 through 15. In FIG. 16, the axes of abscissas and ordinates represent the logarithms of the defect density $n_d$ and the variation ΔVsat. As shown in FIG. 16, the defect density $n_d$ is proportional to the variation ΔVsat. That is to say, if CDE etching is performed and then the variation ΔVsat in saturated voltage is measured, the defect density $n_d$ at the etch depth can be known.

As shown in FIG. 12, two local maximums, or Peaks 1 and 2, exist on the curve representing the variation ΔVsat in saturated voltage. In view of the relationship shown in FIG. 16, the existence of these two peaks means that there are two regions with heavy defect densities. In the first embodiment, the relationship between the CDE etch depth and the density of trapped electrons is obtained based on the variation ΔVsat in saturated voltage with reference to FIG. 4. Thus, considering the existence of these two peaks, the relationship can be regarded as being obtained in an appropriate manner.

According to the method of the second embodiment, since the oxide film 25 is interposed between the Si substrate 21 and the mercury electrode 26, the saturated voltage vsat increases. As a result, the measuring sensitivity can be further improved.

EMBODIMENT 3

A third exemplary embodiment of the present invention will be described as a method for controlling the fabrication process of semiconductor devices.

FIGS. 17(a) through 17(g) are cross-sectional views illustrating a fabrication process of a semiconductor device and a method for controlling the process according to the third embodiment. In this case, a transistor region Rtr where a transistor should be formed and a monitor region Rmn where the damaged layer should be monitored are supposed to be formed in a wafer.

Figure 17A:
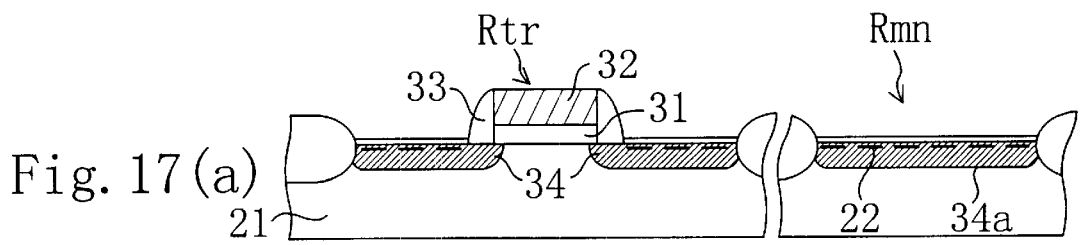
FIGS. 17(a), 17(b), 17(c), 17(d), 17(e), 17(f) and 17(g) are cross-sectional views illustrating a fabrication process of a semiconductor device and a method for controlling the process according to a third embodiment of the present invention.

First, in the process step shown in FIG. 17(a), an n-channel MOS transistor is formed in the transistor region Rtr in the Si wafer 21. Specifically, the n-channel MOS transistor includes: a gate insulating film 31 of silicon dioxide; a gate electrode 32 of polysilicon; a sidewall 33 of silicon dioxide; and n-type lightly doped source/drain (LDD) regions 34 doped with phosphorus at a low level. In the state shown in FIG. 17(a), after the LDD regions 34 have been formed, a silicon dioxide film is deposited on the wafer and etched anisotropically to form the sidewall 33. In this case, an n-type lightly doped region 34a has also been formed in the monitor region Rmn as a result of introduction of phosphorus at a low level. Also, the anisotropic etching to form the sidewall 33 has caused a damaged layer 22 near the surface of the Si wafer 21.

Figure 17B:
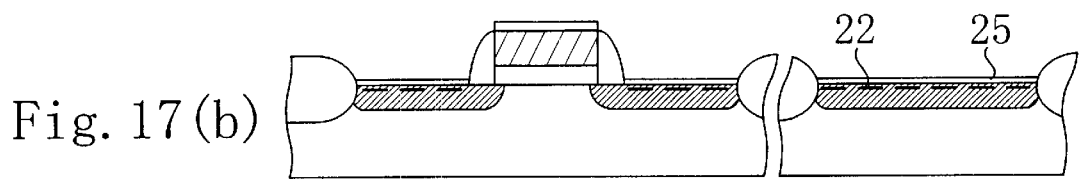

Next, in the process step shown in FIG. 17(b), an exposed part of the Si wafer 21 is CDE-etched, thereby slightly removing the damaged layer 22. Thereafter, an oxide film 25 is formed to be 3 to 4 nm thick over the wafer by downstream remote plasma oxidation.

Figure 17C:
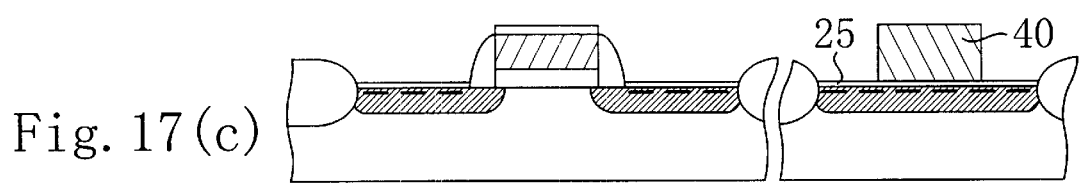

Then, in the process step shown in FIG. 17(c), a metal terminal, like a mercury electrode, is placed on the oxide film 25 over the n-type lightly doped region 34a in the monitor region Rmn to estimate the depth of the damaged layer by the method of the second embodiment. Thereafter, the process steps shown in FIGS. 17(b) and 17(c) are repeatedly performed, thereby obtaining a variation ΔVsat in saturated voltage with a constant current supplied as shown in FIG. 12. And when the point A or C shown in FIG. 12 is reached, it is determined that a non-negligible portion of the damaged to layer, having impact on the performance of the transistor, has been removed to end the CDE etching for the removal of the damaged layer. That is to say, at this point in time, the damaged layer 22 has already been removed.

Figure 17D:
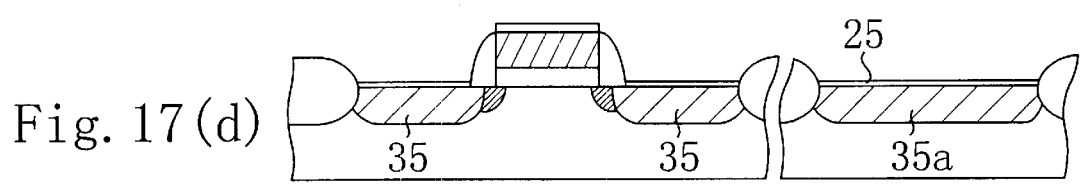

Subsequently, in the process step shown in FIG. 17(d), arsenic ions are implanted at a high level into the Si wafer 21, thereby forming heavily doped source/drain regions 35. In this case, an n-type heavily doped region 35a is also formed in the monitor region Rmn as a result of implantation of arsenic ions at a high level.

Figure 17E:
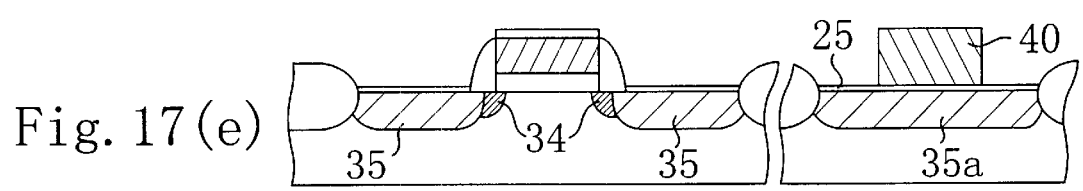

Next, in the process step shown in FIG. 17(e), after the impurities have been diffused by annealing, the metal terminal 40, such as a mercury electrode, is placed again on the oxide film 25 over the n-type heavily doped region 35a in the monitor region Rmn, thereby determining whether or not any ion-implant-induced damaged layer is left near the surface of the wafer. If any part of the damaged layer is still left, the degree of the damage is estimated. And if the wafer has not sufficiently recovered from the damage, additional annealing may be conducted, for example.

There is no need to provide a particular process step of etching the extremely thin oxide film 25, which has been formed to measure the depth of the damaged layer. This is because the oxide film 25 is automatically removed while wet etching is being performed using hydrofluoric acid to remove a natural oxide film formed on the wafer prior to the subsequent silicidation process step.

Figure 17F:
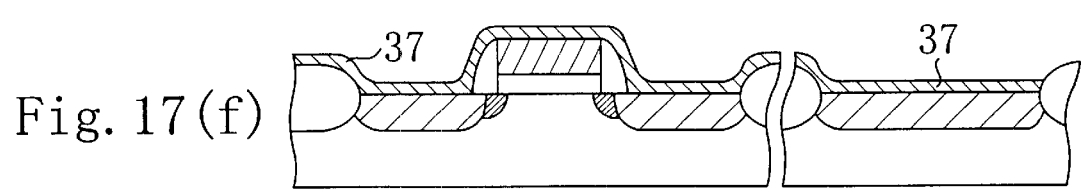
Figure 17G:
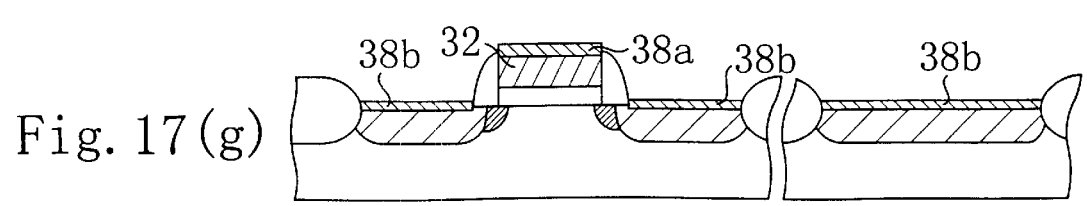

Thereafter, in the process step shown in FIG. 17(f), a refractory metal film 37 of titanium, for example, is formed over the wafer. Then, in the process step shown in FIG. 17(g), the refractory metal film 37 and silicon are allowed to react with each other to form a silicide therebetween and the refractory metal film 37 is removed. As a result, silicide films 38a and 38b are formed on the respective surfaces of the gate electrode 32 and Si wafer 21.

According to the method of the third embodiment, the fabrication process of semiconductor devices, which includes the steps of: etching a semiconductor wafer with plasma to form a damaged layer therein; and removing the damaged layer, can be controlled by utilizing the method for examining a semiconductor wafer of the second embodiment.

Also, not only the plasma-etch-induced damaged layer, but also the ion-implant-induced damaged layer are evaluated. Accordingly, it is possible to determine whether or not conditions for ion implantation and annealing, which is conducted after the ion implantation, are appropriate.

If the damaged layer is removed by the CDE technique, the endpoint of the CDE etching may be detected by using a monitor wafer, in addition to a wafer from which devices are fabricated.

The endpoint may also be detected by the evaluating method of the first embodiment, not by the method of the second embodiment. In such a case, the oxide film 25 is not formed. And it may be determined that the etch-induced damaged layer has been removed when the etch depth reaches a value associated with the largest variation $\Delta V$ in voltage shown in FIG. 2 with a constant current supplied. Alternatively, it may also be determined that etching has reached its endpoint when the etch depth reaches a value associated with the maximum defect density N shown in FIG. 4.

In either case, if the relationship between a contact resistance in a heavily doped region and a variation in voltage, which is a parameter representing a CDE etch depth for the removal of the damaged layer, is known in advance as described in the first and second embodiments, the fabrication process can be controlled with much higher sensitivity and accuracy than those attained by the conventional I-V method.

In the process steps shown in FIGS. 17(c) and 17(e), a mercury electrode is used as the metal terminal 40. Even so, there is no problem if the next step is performed after the surface of the semiconductor wafer, which has been in contact with the mercury electrode, has been cleaned. Also, the electrode may be made of any arbitrary metal other than mercury.

Furthermore, after the process step of removing the etch-induced damaged layer has been performed, the conditions for the removal process step may be modified depending on how much of the damaged layer is left. For example, the CDE time may be extended or the CDE ambient may be adjusted to a preferable state.

What is claimed is:

1. A method for examining a semiconductor substrate, comprising the steps of:
    a) placing a measuring terminal having a mercury electrode on the semiconductor substrate, thereafter contacting the mercury electrode to a surface of the semiconductor substrate to be measured by moving the mercury electrode;
    b) applying current as an electrical stress between the substrate and the mercury electrode at a constant rate to measure a variation in voltage, which is the other electrical stress caused between the substrate and the mercury electrode; and
    c) evaluating the surface state of the very substrate based on the variation in the other electrical stress.

2. The method of claim 1, wherein in the step a), a Schottky barrier is formed between the semiconductor substrate and the mercury electrode, and
    wherein in the step b), the electrical stress is applied in such a direction as causing a forward current.

3. The method of claim 2, wherein the steps a) through c) are performed on an initial semiconductor substrate with a damaged layer formed within the surface thereof and on a processed semiconductor substrate, from which part of the damaged layer has been removed by a predetermined depth, and wherein it is estimated how deep the damaged layer has been removed based on the variation in the other electrical stress between the initial and processed semiconductor substrates.

4. The method of claim 3,
    wherein in the step c), a defect density N in a surface region of the semiconductor substrate is obtained based on a variation $\Delta V$ in the voltage, which is the other electrical stress, with time, the variation $\Delta V$ being given by $$\Delta V = X \cdot q \cdot N / \in$$

where X is a depth at which a charge trap center is located, q is a quantity of charges and $\in$ is a relative dielectric constant of the semiconductor substrate.

5. The method of claim 1, further comprising the step of forming an oxide film over the semiconductor substrate prior to the step a),
    wherein in the step a), the measuring terminal is placed on the oxide film formed over the semiconductor substrate, thereafter the mercury electrode is contacted to the surface of the semiconductor substrate to be measured by moving the mercury electrode.

6. The method of claim 5, wherein in the step of forming the oxide film, the oxide film is formed at a temperature as low as 400° C. or less.

7. The method of claim 5, wherein in the step of forming the oxide film, the oxide film is formed to have such a thickness as enabling charge tunneling.

8. The method of claim 5, wherein the steps a) through c) are performed on an initial semiconductor substrate with a damaged layer formed within the surface thereof and on a processed semiconductor substrate, from which part of the damaged layer has been removed by a predetermined depth, and wherein it is estimated how deep the damaged layer has been removed based on the variation in the other electrical stress between the initial and processed semiconductor substrates.

9. The method of claim 8, wherein in the step c), a depth, at which a variation in saturation value of the voltage, or the other electrical stress, reaches its local maximum, is estimated as the depth of the damaged layer.

10. A method for controlling a fabrication process of semiconductor devices, the fabrication process including the steps of: i) processing a semiconductor substrate under conditions which may cause damage to the substrate; and ii) removing a damaged layer, which has been caused by the step i), the method comprising the steps of:

a) placing a measuring terminal having a mercury electrode on the substrate at an arbitrary point in time during the steps i and ii), thereafter contacting the mercury electrode to a surface of the semiconductor substrate to be measured by moving the mercury electrode;

b) applying current as an electrical stress between the substrate and the mercury electrode at a constant rate to measure a variation in voltage, which is the other electrical stress caused between the substrate and the mercury electrode;

c) evaluating the surface state of the very substrate based on the variation in the other electrical stress; and d) controlling the step ii) based on results of evaluation in the step c).

11. The method of claim 10, wherein in the step d), conditions for the step ii) are changed.

12. The method of claim 10, wherein in the step d), an endpoint of the step ii) is detected.

13. The method of claim 10, wherein in the step a), a Schottky barrier is formed between the semiconductor substrate and the mercury electrode, and wherein in the step b), the electrical stress is applied in such a direction as causing a forward current.

14. The method of claim 13, wherein the steps a) through c) are performed on an initial semiconductor substrate with a damaged layer formed within the surface thereof and on a processed semiconductor substrate, from which part of the damaged layer has been removed by a predetermined depth, and wherein in the step d), the step ii) is controlled based on the variation in the other electrical stress between the initial and processed semiconductor substrates.

15. The method of claim 14, wherein in the step c), a defect density N in a surface region of the semiconductor substrate is obtained based on a variation $\Delta V$ in the voltage with time, the variation $\Delta V$ being given by $$\Delta V = X \cdot q \cdot N / \in$$

where X is a depth at which a charge trap center is located, q is a quantity of charges and $\in$ is a relative dielectric constant of the semiconductor substrate, and wherein in the step d), when a variation in the defect density N between the initial and processed semiconductor substrates reaches a predetermined value, it is determined that the step ii) is finished.

16. The method of claim 10, further comprising the step of forming an oxide film over the semiconductor substrate prior to the step a), wherein in the step a), the measuring terminal is placed on the oxide film formed over the semiconductor substrate, thereafter the mercury electrode is connected to the surface of the semiconductor substrate to be measured by moving the mercury electrode.

17. The method of claim 16, wherein the steps a) through c) are performed on an initial semiconductor substrate with a damaged layer formed within the surface thereof and on a processed semiconductor substrate, from which part of the damaged layer has been removed by a predetermined depth, and wherein in the step d), the step ii) is controlled based on the variation in the other electrical stress between the initial and processed semiconductor substrates.

18. The method of claim 16, wherein in the step of forming the oxide film, the oxide film is formed at a temperature as low as 400° C. or less.

19. The method of claim 16, wherein in the step of forming the oxide film, the oxide film is formed to have such a thickness as enabling charge tunneling.

20. The method of claim 16, wherein in the step c), a depth, at which a variation in saturation value of the voltage, or the other electrical stress, reaches its local maximum, is estimated as the depth of the damaged layer.

21. A method for examining a semiconductor substrate, comprising the steps of:

a) placing a measuring terminal having a mercury electrode on the semiconductor substrate, thereafter contacting the mercury electrode to a surface of the semiconductor substrate to be measured by moving the mercury electrode;

b) applying voltage between the substrate and the mercury electrode at a constant rate to measure a variation in current caused between the substrate and the mercury electrode; and c) evaluating the surface state of the very substrate based on the variation in current.

22. A method for controlling a fabrication process of semiconductor devices, the fabrication process including the steps of: i) processing a semiconductor substrate under conditions which may cause damage to the substrate; and ii) removing a damaged layer, which has been caused by the step i), the method comprising the steps of:

a) placing a measuring terminal having a mercury electrode on the substrate at an arbitrary point in time during the steps i) and ii), thereafter contacting the mercury electrode to a surface of the semiconductor substrate to be measured by moving the mercury electrode;

b) applying voltage between the substrate and the mercury electrode at a constant rate to measure a variation in current caused between the substrate and the mercury electrode;

c) evaluating the surface state of the very substrate based on the variation in current; and d) controlling the step ii) based on results of evaluation in the step c).

* * * * *